US012660107B2

(12) United States Patent
Chun et al.

(10) Patent No.: US 12,660,107 B2
(45) Date of Patent: Jun. 16, 2026

(54) ELECTRONIC DEVICE COMPRISING STRUCTURE FOR PREVENTING FRACTURE OF DISPLAY PANEL

(71) Applicant: Samsung Electronics Co., Ltd., Suwon-si (KR)

(72) Inventors: Woosung Chun, Suwon-si (KR); Seungki Choi, Suwon-si (KR); Jungchul An, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 266 days.

(21) Appl. No.: 17/837,759

(22) Filed: Jun. 10, 2022

(65) Prior Publication Data

US 2023/0049694 A1 Feb. 16, 2023

Related U.S. Application Data

(63) Continuation of application No. PCT/KR2022/007512, filed on May 26, 2022.

(30) Foreign Application Priority Data

Aug. 10, 2021 (KR) ........................ 10-2021-0105246

(51) Int. Cl.
| | |
|---|---|
| *H05K 5/02* | (2006.01) |
| *G06F 1/16* | (2006.01) |
| *H05K 5/00* | (2006.01) |

(52) U.S. Cl.
CPC ......... *H05K 5/0226* (2013.01); *G06F 1/1652* (2013.01); *G06F 1/1681* (2013.01); *H05K 5/0017* (2013.01)

(58) Field of Classification Search
CPC ..... H05K 5/0226; H05K 5/0017; F16C 11/04; G02F 1/1333
See application file for complete search history.

(56) References Cited

U.S. PATENT DOCUMENTS

| | | | |
|---|---|---|---|
| 9,557,771 B2 | 1/2017 | Park et al. | |
| 9,756,757 B2 * | 9/2017 | Park ........................ | H05K 7/16 |

(Continued)

FOREIGN PATENT DOCUMENTS

| | | |
|---|---|---|
| CN | 109830185 A | 5/2019 |
| EP | 3657297 A2 | 5/2020 |

(Continued)

OTHER PUBLICATIONS

International Search Report dated Aug. 24, 2022, issued in International Patent Application No. PCT/KR2022/007512.

(Continued)

*Primary Examiner* — Rockshana D Chowdhury
*Assistant Examiner* — Douglas R Burtner
(74) *Attorney, Agent, or Firm* — Jefferson IP Law, LLP

(57) ABSTRACT

An electronic device is provided. The electronic device includes a first housing, second housing, a hinge structure rotatably connecting a side surface of the first housing and a side surface of the second housing facing the side surface of the first housing along a folding axis, a flexible display panel including a first display area, a second display area, and a third display area, and a supporting member supporting the flexible display panel. The supporting member includes a flexible region including plural openings having a length in a direction parallel to the folding axis, spaced apart from each other, and corresponding to the third display area, and rigid regions corresponding to the first display area and the second display area. Both ends of each of the openings partially overlapped on the plurality of gears are (Continued)

disposed outside the plurality of gears projected onto the support member.

20 Claims, 18 Drawing Sheets

(56) References Cited

U.S. PATENT DOCUMENTS

| | | | | |
|---|---|---|---|---|
| 10,111,346 | B2 * | 10/2018 | Seo | H05K 1/189 |
| 10,558,242 | B2 * | 2/2020 | Kim | G06F 1/1681 |
| 10,912,214 | B2 * | 2/2021 | Kang | H05K 5/0217 |
| 10,925,176 | B2 | 2/2021 | Lee | |
| 11,086,356 | B2 | 8/2021 | Hou et al. | |
| 11,099,691 | B2 | 8/2021 | Park | |
| 11,237,596 | B2 | 2/2022 | Kim et al. | |
| 11,258,035 | B2 * | 2/2022 | Kim | H05K 1/147 |
| 11,334,123 | B2 * | 5/2022 | Kim | E05D 3/122 |
| 11,416,036 | B2 * | 8/2022 | Yin | G06F 1/1652 |
| 11,432,779 | B2 | 9/2022 | Lee et al. | |
| 11,543,854 | B2 * | 1/2023 | Park | G06F 1/1616 |
| 11,563,835 | B2 * | 1/2023 | Lim | G06F 1/1624 |
| 11,647,597 | B2 * | 5/2023 | Liu | H04M 1/0235 |
| | | | | 361/807 |
| 11,775,016 | B2 * | 10/2023 | Choi | G06F 1/1681 |
| | | | | 361/679.01 |
| 11,864,334 | B2 * | 1/2024 | Lee | G06F 1/1652 |
| 11,886,255 | B2 * | 1/2024 | Lee | G06F 1/1624 |
| 11,921,545 | B2 * | 3/2024 | Feng | H04M 1/0268 |
| 12,298,806 | B2 | 5/2025 | Lee et al. | |
| 12,316,791 | B2 | 5/2025 | Liao et al. | |
| 2013/0135877 | A1 | 5/2013 | Oh et al. | |
| 2019/0036068 | A1 * | 1/2019 | Kim | G06F 1/1601 |
| 2019/0166703 | A1 | 5/2019 | Kim et al. | |
| 2019/0200466 | A1 * | 6/2019 | Kim | G06F 1/1652 |
| 2020/0137907 | A1 * | 4/2020 | Kang | G06F 1/1681 |
| 2020/0170127 | A1 * | 5/2020 | Kim | H05K 5/0226 |
| 2020/0383217 | A1 | 12/2020 | Kim et al. | |
| 2021/0011527 | A1 | 1/2021 | Alva et al. | |
| 2021/0068272 | A1 * | 3/2021 | Horiuchi | G06F 1/1616 |
| 2021/0111357 | A1 * | 4/2021 | Kawaguchi | H10K 59/40 |
| 2021/0141124 | A1 * | 5/2021 | Park | G09F 9/301 |
| 2021/0168953 | A1 * | 6/2021 | Lee | H05K 5/0226 |
| 2021/0216112 | A1 | 7/2021 | Shin et al. | |
| 2021/0233447 | A1 * | 7/2021 | Park | G06F 1/1616 |
| 2021/0352814 | A1 * | 11/2021 | Park | G06F 1/1652 |
| 2022/0075418 | A1 * | 3/2022 | Song | G06F 1/1656 |
| 2022/0087040 | A1 * | 3/2022 | Song | G06F 1/1681 |
| 2022/0159845 | A1 * | 5/2022 | Feng | G06F 1/1616 |
| 2022/0174829 | A1 * | 6/2022 | Choi | G06F 1/1637 |
| 2022/0198966 | A1 * | 6/2022 | Park | G09F 9/301 |
| 2022/0217859 | A1 * | 7/2022 | Lee | H05K 5/0017 |
| 2022/0217863 | A1 * | 7/2022 | Kim | G06F 1/1616 |
| 2022/0240400 | A1 * | 7/2022 | Zhou | G09F 9/301 |
| 2022/0287189 | A1 * | 9/2022 | Kim | H04M 1/0268 |
| 2022/0294886 | A1 * | 9/2022 | Seo | G09G 3/035 |
| 2022/0322542 | A1 * | 10/2022 | Wu | G06F 1/1637 |
| 2023/0026298 | A1 * | 1/2023 | Ahn | H04M 1/0202 |
| 2023/0040036 | A1 * | 2/2023 | Lee | G06F 1/16 |
| 2023/0044949 | A1 * | 2/2023 | Park | H05K 5/0226 |
| 2023/0229189 | A1 * | 7/2023 | Li | G06F 1/1616 |
| 2023/0262914 | A1 * | 8/2023 | Kang | H05K 5/06 |
| | | | | 361/807 |
| 2023/0350462 | A1 * | 11/2023 | Jung | H04M 1/0268 |
| 2024/0032227 | A1 * | 1/2024 | Cheng | G09F 9/301 |

FOREIGN PATENT DOCUMENTS

| | | |
|---|---|---|
| JP | 2019-028467 A | 2/2019 |
| JP | 2021-513683 A | 5/2021 |
| KR | 2000-0055595 A | 9/2000 |
| KR | 10-20150142290 A | 12/2015 |
| KR | 10-2018-0094172 A | 8/2018 |
| KR | 10-2020-0047253 A | 5/2020 |
| KR | 10-2020-0108754 A | 9/2020 |
| KR | 10-2020-0109722 A | 9/2020 |
| KR | 10-20200140126 A | 12/2020 |
| KR | 10-2021-0081045 A | 7/2021 |
| KR | 10-2369212 B1 | 2/2022 |
| KR | 10-2460559 B1 | 11/2022 |
| WO | 2021/015310 A1 | 1/2021 |
| WO | 2021/115462 A1 | 6/2021 |

OTHER PUBLICATIONS

Extended European Search Report dated Oct. 18, 2024, issued in International Patent Application No. 22855976.1.

Korean Notice of Decision of Grant dated Jun. 5, 2025, issued in a Korean Patent Application No. 10-2021-0105246.

Japanese Office Action with English translation dated Mar. 31, 2026; Japanese Appln. No. 2024-507874.

* cited by examiner

ELECTRONIC DEVICE COMPRISING STRUCTURE FOR PREVENTING FRACTURE OF DISPLAY PANEL

CROSS-REFERENCE TO RELATED APPLICATION(S)

This application is a continuation application, claiming priority under § 365(c), of an International application No. PCT/KR2022/007512, filed on May 26, 2022, which is based on and claims the benefit of a Korean patent application number 10-2021-0105246, filed on Aug. 10, 2021, in the Korean Intellectual Property Office, the disclosure of which is incorporated by reference herein in its entirety.

TECHNICAL FIELD

The disclosure relates to an electronic device comprising a structure for preventing fracture of a display panel. More particularly, the disclosure relates to a flexible electronic device comprising a structure for preventing fracture of a display panel by way of a support member supporting the flexible display panel and a hinge structure.

BACKGROUND ART

Users use mobile devices while moving and carry them all the time. The mobile device may include various components therein. In order to increase portable convenience, electronic devices are getting smaller. Due to the demand for thinning of the electronic device, the thickness of the mobile electronic device is getting thinner, and the mounting space for various parts is decreasing.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide an electronic device comprising a structure for preventing fracture of a display panel.

Due to the thinning of the electronic device, the electronic device may comprise electronic components mounted in a narrow space. Each of the electronic components with a short separation distance has the possibility of colliding with each other due to an external impact. The electronic device may not operate normally due to damage of components due to collision between internal components.

In order to prevent collision of internal components from external force applied to the electronic device, a method is needed to prevent interference between components that may cause movement or vibration due to an external impact and other components.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device comprises a first housing including a first surface and a second surface faced away the first surface, a second housing including a third surface and a fourth surface faced away the fourth surface, a hinge structure configured to switch the electronic device to an unfolded state in which a first direction facing the first surface and a second direction facing the third surface are the same or a folded state in which the first direction and the second direction are different, by connecting a side surface of the first housing and a side surface of the second surface facing the side surface of the first housing pivotably along a folding axis, the hinge structure including a plurality of gears disposed in a direction perpendicular to the folding axis and rotating in engagement with each other, a flexible display panel including a first display area disposed on the first surface and the third surface across the folding axis, a second display area corresponding to the third surface, and a third display area between the first display area and the second display area, and a supporting member supporting the flexible display panel, the supporting member including a flexible region including a plurality of openings having a length in a direction parallel to the folding axis, spaced apart from each other, and corresponding to the third display area, and a rigid region corresponding to the first display area and the second display area, wherein the plurality of gears may be disposed under the first region among the first region and the second region, and wherein both ends of each of the openings at least partially overlapped on the plurality of gears among the plurality of openings may be disposed in the second region.

In accordance with another aspect of the disclosure, an electronic device is provided. The electronic device comprises a first housing including a first surface and a second surface faced away the first surface, a second housing including a third surface and a fourth surface faced away the fourth surface, a hinge structure configured to switch the electronic device to an unfolded state in which a first direction facing the first surface and a second direction facing the third surface are the same or a folded state in which the first direction and the second direction are different, by connecting a side surface of the first housing and a side surface of the second surface facing the side surface of the first housing pivotably along a folding axis and a plurality of gears disposed in a direction perpendicular to the folding axis and rotating in engagement with each other, a flexible display panel including a first display area disposed on the first surface and the third surface across the folding axis, a second display area corresponding to the third surface, and a third display area between the first display area and the second display area, and a supporting member supporting the flexible display panel, the supporting member including a flexible region including a plurality of openings having a length in a direction parallel to the folding axis, spaced apart from each other, and corresponding to the third display area, and a rigid region corresponding to the first display area and the second display area, wherein both ends of each of the openings at least partially overlapped on the plurality of gears among the plurality of openings may be disposed outside the plurality of gears projected on the support member.

Advantageous Effects

According to the thinning of the electronic device, interference between components due to an external force (e.g., a drop impact or an external impact) and other components can be prevented. The flexible electronic device can prevent interference between a support member supporting the flexible display panel and a hinge structure.

The electronic device can prevent damage to internal components by preventing interference due to external impact.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
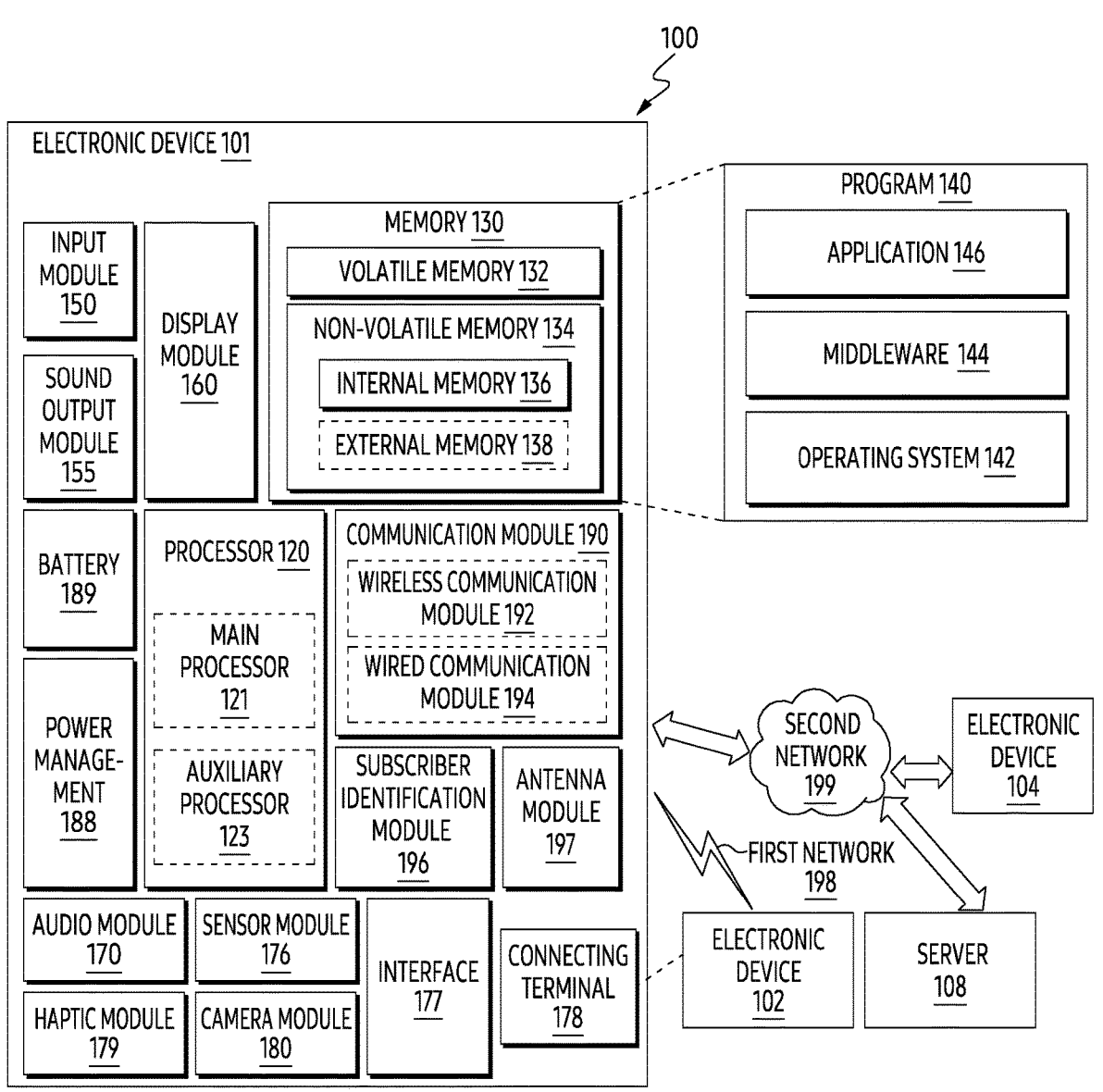
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, a hologram device, and a projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
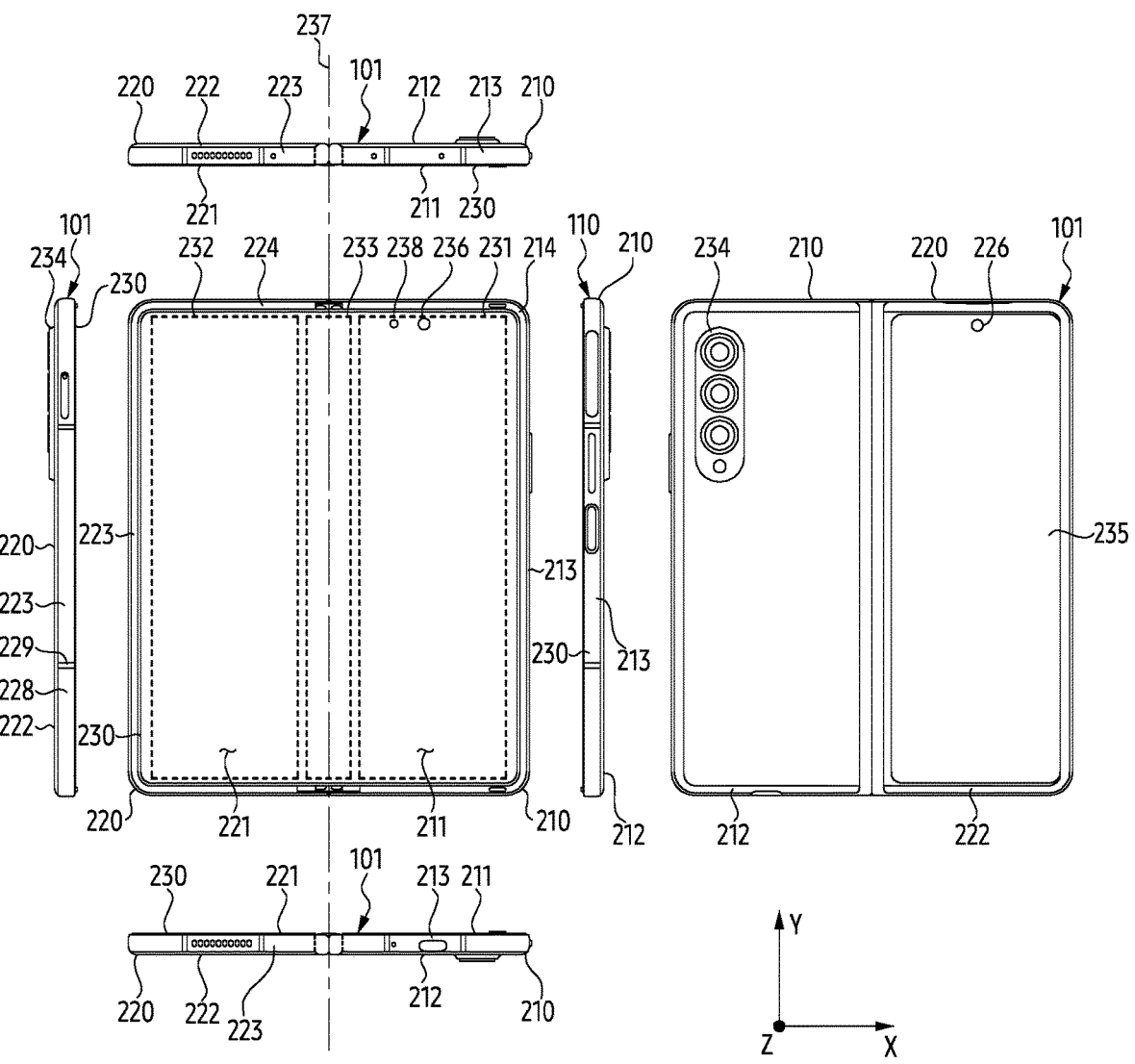
FIG. 2A illustrates an unfolded state of an electronic device according to an embodiment of the disclosure.

FIG. 2A illustrates an unfolded state of an electronic device according to an embodiment of the disclosure.

Figure 2B:
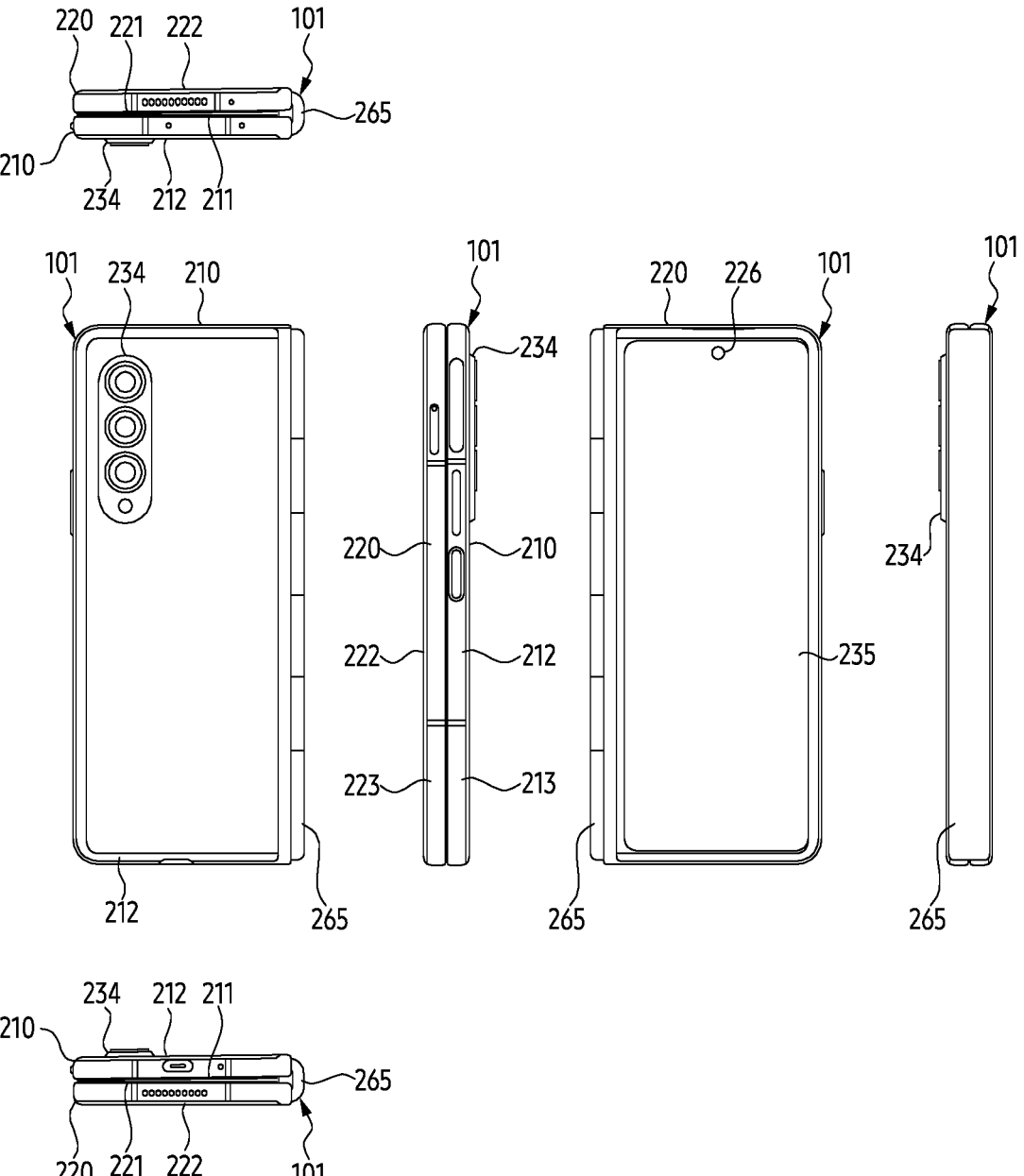
FIG. 2B illustrates a folded state of an electronic device according to an embodiment of the disclosure.

FIG. 2B illustrates a folded state of an electronic device according to an embodiment of the disclosure.

Figure 2C:
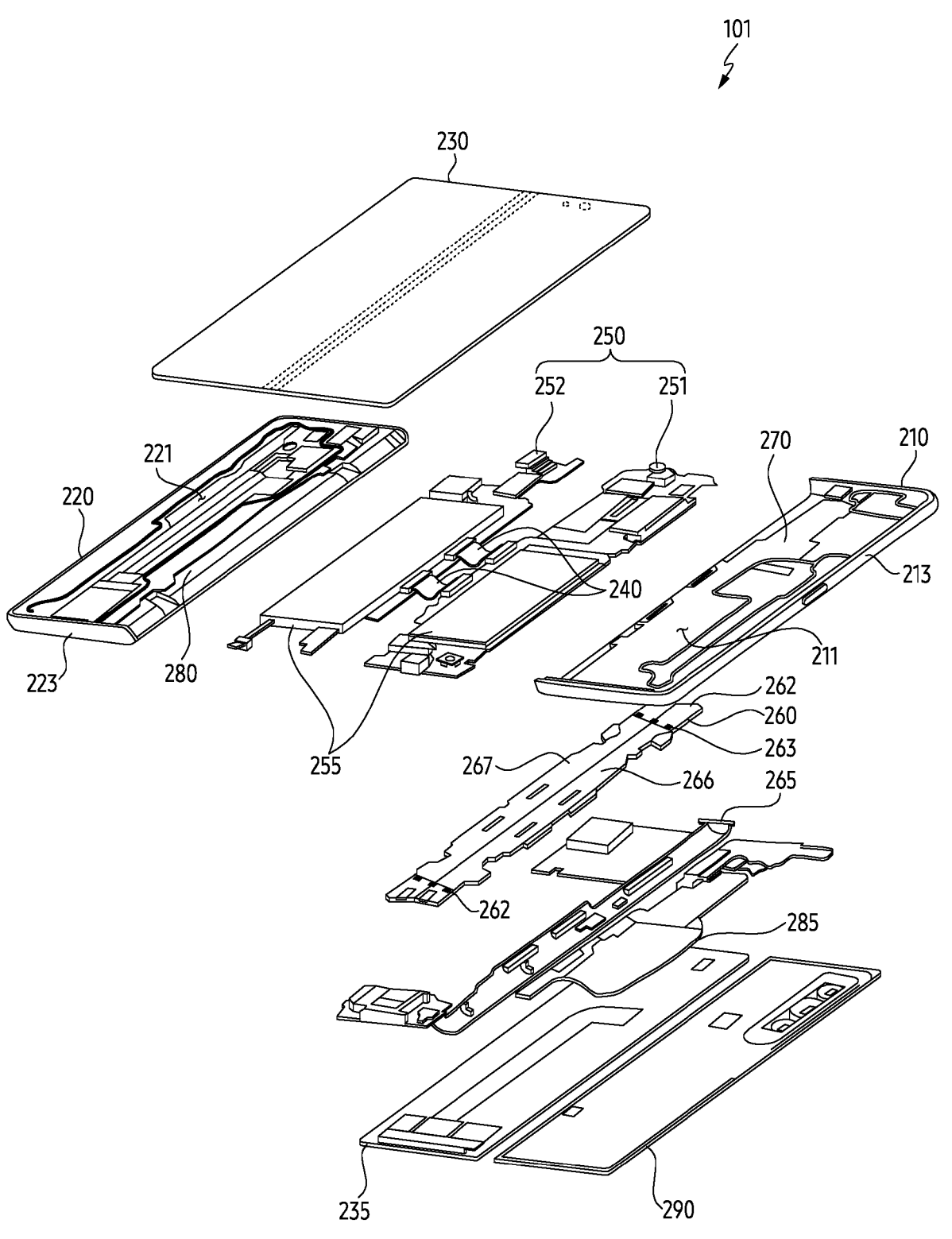
FIG. 2C is an exploded view of an electronic device according to an embodiment of the disclosure.

FIG. 2C is an exploded view of an electronic device according to an embodiment of the disclosure.

Figure 2D:
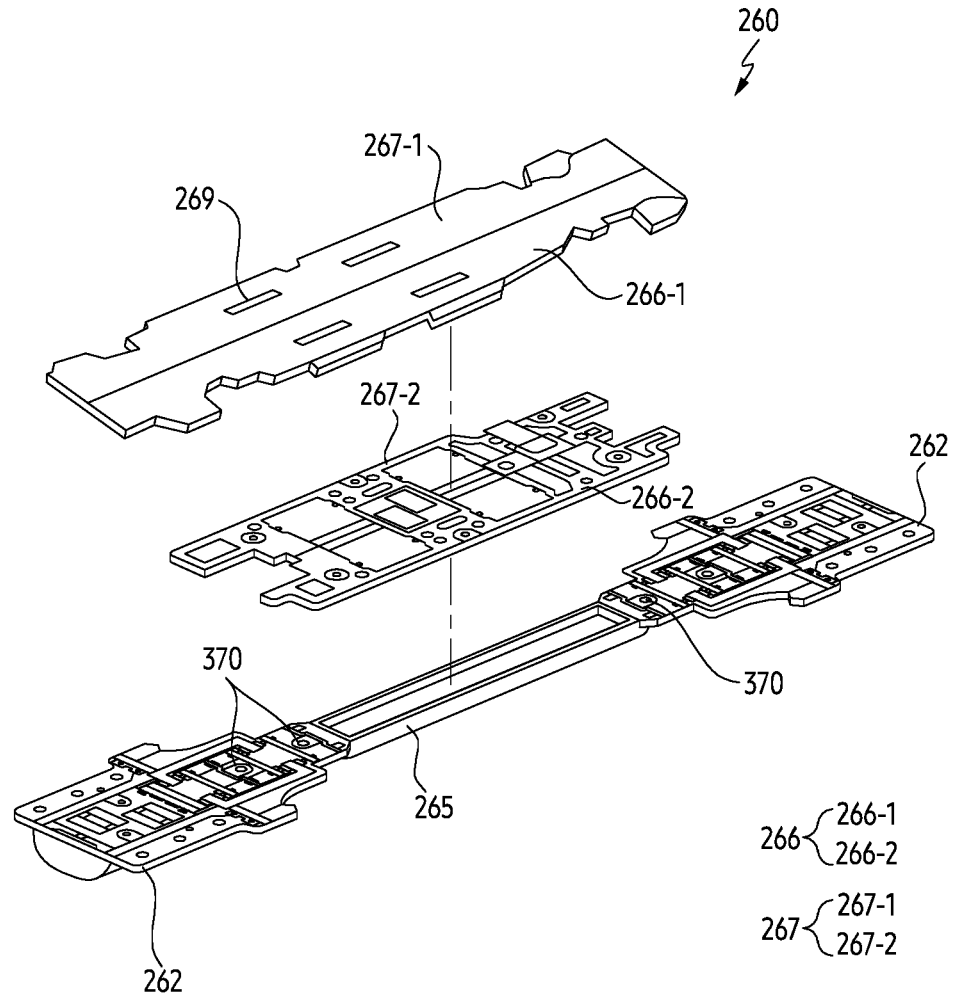
FIG. 2D is an exploded view of a hinge structure according to an embodiment of the disclosure.

FIG. 2D is an exploded view of a hinge structure according to an embodiment of the disclosure.

Referring to FIGS. 2A, 2B, and 2C, the electronic device 101 may include a first housing 210, a second housing 220, and a flexible display panel 230.

In an embodiment of the disclosure, the first housing 210 may comprise a first surface 211 and a second surface 212 faced away from the first surface 211 and a first side surface 213 surrounding at least a portion of the first surface 211 and the second surface 212. In an embodiment of the disclosure, the second surface 212 may further comprise at least one camera 234 exposed through a portion of the second surface 212. In an embodiment of the disclosure, the first housing 210 may comprise a first protection member 214 disposed along a periphery of the first surface 211. In an embodiment of the disclosure, the first housing 210 may provide a space formed by the first surface 211, the second surface 212, and the first side surface 213, as a space for mounting components of the electronic device 101. In an embodiment of the disclosure, the first side surface 213 and the second side surface 223 may include a conductive material, a non-conductive material, or a combination thereof. For example, the second side surface 223 may include a conductive member 228 and a non-conductive member 229. The conductive member 228 may include a plurality of conductive members and may be spaced apart from each other. The non-conductive member 229 may be disposed between a plurality of conductive members. An antenna structure may be formed by a part or a combination of a plurality of conductive members and a plurality of non-conductive members.

In an embodiment of the disclosure, the second housing 220 may include a third surface 221, a fourth surface 222 faced away the third surface 221, and a second side surface 223 surrounding at least a portion of the third surface 221 and the fourth surface 222. In an embodiment of the disclosure, the fourth surface 222 may further include a display panel 235 disposed on the fourth surface 222. The camera 226 may be disposed to face the fourth surface 222 from the inside of the second housing 220 so as to obtain an external image through the fourth surface 222. In an embodiment of the disclosure, camera 226 may be disposed under display panel 235, and display panel 235 may include an opening aligned with camera 226 lens to transmit light from the outside to camera 226. According to an embodiment of the disclosure, each of the first housing 210 and the second housing 220 may include a first protection member 214 and a second protection member 224. The first protection member 214 and the second protection member 224 may be disposed on the first surface 211 and the third surface 221 along the periphery of the flexible display panel 230. The first protection member 214 and the second protection member 224 may prevent the inflow of foreign substances (e.g., dust or moisture) through a gap between the flexible display panel 230 and the first housing 210 and the second housing 220. The first protection member 214 may be disposed along the periphery of the first display area 231, and the second protection member 224 may be disposed along the periphery of the second display area 232. The first protection member 214 may be formed by being attached to the first side surface 213 of the first housing 210 or integrally formed with the first side surface 213. The second protection member 224 may be formed by being attached to the second side surface 223 of the second housing 220 or integrally formed with the second side surface 223.

In an embodiment of the disclosure, the second side surface 223 may be rotatably connected to the first side surface 213 through a hinge structure 260 mounted on a hinge cover 265. The hinge structure 260 may include a hinge module 262, a first hinge plate 266, and a second hinge plate 267. The first hinge plate 266 may be connected to the first housing 210, and the second hinge plate 267 may be connected to the second housing 220. In an embodiment of the disclosure, the second housing 220 may provide a space formed by the third surface 221 and the fourth surface 222 facing the third surface 221 and the second side surface 223 surrounding at least a portion of the third surface 221 and the fourth surface 222, as a space for mounting components of the electronic device 101. In an embodiment of the disclosure, the flexible display panel 230 may include a window exposed toward the outside. The window may protect the surface of the flexible display panel 230 and may be formed as a protection layer to transmit visual information provided from the flexible display panel 230 to the outside. The window may include a glass material, such as ultra-thin glass (UTG) or a polymer material, such as polyimide (PI). In an embodiment of the disclosure, the flexible display panel 230 may be disposed on the first surface 211 of the first housing 210 and the third surface 221 of the second housing 220 across the hinge cover 265. The flexible display panel 230 may include a first display area 231 disposed on the first surface 211 of the first housing, a second display area 232 disposed on the third surface 221 of the second housing, and a third display area 233 between the first display area 231 and the second display area 232. The first display area 231, the second display area 232, and the third display area 233 may form a front surface of the flexible display panel 230.

According to an embodiment of the disclosure, an opening may be formed in a part of the screen display area of the flexible display panel 230 or a recess or an opening may be formed in a support member (e.g., a bracket) supporting the flexible display panel 230. The electronic device 101 may include at least one of a sensor module 238 aligned with the recess or the opening and a camera 236. For example, the first display area 231 may further include a camera 236 capable of obtaining an image from the outside through a part of the first display area 231 and a sensor module 238 that generates an electrical signal or data value corresponding to an external environmental state. According to an embodiment of the disclosure, at least one of the sensor module 238 and the camera 236 may be included on the rear surface of the flexible display panel 230 corresponding to the first display area 231 or the second display area 232 of the flexible display panel 230. For example, at least one of the camera 236 and the sensor module 238 may be disposed under the flexible display panel 230 and surrounded by the flexible display panel 230. At least one of the camera 236 and the sensor module 238 may be surrounded by the flexible display panel 230 and may not be exposed to the outside. However, this disclosure is not limited thereto, and the flexible display panel 230 may include an opening exposing the camera 236 and the sensor module 238 to the outside. Although not illustrated in FIGS. 2A and 2B, in one embodiment of the disclosure, the flexible display panel 230 may further include a rear surface opposite to the front surface. In an embodiment of the disclosure, the flexible display panel 230 may be supported by the first support member 270 of the first housing 210 and a second support member 280 of the second housing 220.

In an embodiment of the disclosure, the hinge structure 260 may be configured to form a first housing 210, form a first support member 270 and a second housing 220 fastened to the first hinge plate 266, and rotatably connect a second support member 280 fastened to the second hinge plate 267.

In an embodiment of the disclosure, the hinge cover 265 surrounding the hinge structure 260 may be exposed at least partially through between the first housing 210 and the second housing 220 while the electronic device 101 is in a folded state. In another embodiment of the disclosure, the hinge cover 265 may be covered by the first housing 210 and the second housing 220 while the electronic device 101 is in an unfolded state.

In an embodiment of the disclosure, the electronic device 101 may be folded based on the folding axis 237 passing through the hinge cover 265. For example, the hinge cover 265 may be disposed between the first housing 210 and the second housing 220 of the electronic device 101 to allow the electronic device 101 to be bent, curved, or folded. For example, the first housing 210 may be connected to the second housing 220 through a hinge structure 260 mounted on the hinge cover 265 and may rotate based on the folding axis 237. For example, the hinge structure 260 may include hinge modules 262 disposed at both ends of the first hinge plate 266 and the second hinge plate 267. Since the hinge module 262 includes hinge gears engaged with each other therein, the hinge module 262 may rotate the first hinge plate 266 and the second hinge plate 267 based on the folding axis. The first housing 210 coupled to the first hinge plate 266 is connected to the second housing 220 coupled to the second hinge plate 267 and may be rotated based on the folding axis by hinge modules 262.

In one embodiment of the disclosure, the electronic device 101 may be folded to face each other the first housing 210 and the second housing 220 by rotating based on the folding axis 237. In one embodiment of the disclosure, the electronic device 101 may be folded so that the first housing 210 and the second housing 220 overlap or overlap each other.

Referring to FIGS. 2C and 2D, the electronic device 101 may include a first support member 270, a second support member 280, a hinge structure 260, a flexible display panel 230, a printed circuit board 250, a battery 255, a hinge cover 265, an antenna 285, a display panel 235, and a rear plate 290. According to an embodiment of the disclosure, the electronic device 101 may omit at least one of the components or may additionally include another component. At least one of the components of the electronic device 300 may be the same as or similar to at least one of the components of the electronic device 101 of FIG. 1, 2A or 2B, and an overlapping description will be omitted below.

The hinge structure 260 may include a hinge module 262, a first hinge plate 266, and a second hinge plate 267. The hinge module 262 may include a hinge gear 263 that pivotable the first hinge plate 266 and the second hinge plate 267. The hinge gears 263 may rotate the first hinge plate 266 and the second hinge plate 267 while rotating in engagement each other. The hinge module 262 may be plural and may be disposed at both ends of the first hinge plate 266 and the second hinge plate 267, respectively. The hinge module 262 may be coupled to the hinge cover 265 through a plurality of screws 370.

The first hinge plate 266 may be coupled to the first support member 270 of the first housing 210, and the second hinge plate 267 may be coupled to the second support member 280 of the second housing 220. The first housing 210 and the second housing 220 may rotate to correspond to rotation of the first hinge plate 266 and the second hinge plate 267.

The first hinge plate 266 may include a first support plate 266-1 and a second support plate 266-2, and the second hinge plate 267 may include a third support plate 267-1 and a fourth support plate 267-2. The first support plate 266-1 and the third support plate 267-1 may include openings 269 for passing through the flexible printed circuit board 240. The second support plate 266-2 and the fourth support plate 267-2 may be fastened to the first support member 270 and the second support member 280.

The first housing 210 may include a first support member 270 and a second support member 280. The first support member 270 may be partially surrounded by the first side surface 213, and the second support member 280 may be partially surrounded by the second side surface 223. The first support member 270 may be integrally formed with the first side surface 213, and the second support member 280 may be integrally formed with the second side surface 223. According to an embodiment of the disclosure, the first support member 270 may be formed separately from the first side surface 213, and the second support member 280 may be formed separately from the second side surface 223. The first side surface 213 and the second side surface 223 may be formed of a metal material, a non-metal material, or a combination thereof, and may be used as an antenna.

The first support member 270 may be coupled to the flexible display panel 230 on one surface, and may be coupled to the rear plate 290 on the other surface. The second support member 280 may be coupled to the flexible display panel 230 on one surface and the display panel 235 on the other surface.

The printed circuit board 250 and the battery 255 may be disposed between a surface formed by the first support member 270 and the second support member 280 and a surface formed by the display panel 235 and the rear plate 290. The printed circuit board 250 may be separated so as to be disposed on each of the first support member 270 of the first housing 210 and the second support member 280 of the second housing 220. The shapes of the first printed circuit board 251 disposed on the first support member 270 and the second printed circuit board 252 disposed on the second support member 280 may be different depending on the space inside the electronic device. Components for implementing various functions of the electronic device 101 may be mounted on the first printed circuit board 251 and the second printed circuit board 252. According to an embodiment of the disclosure, components for implementing the overall function of the electronic device 101 may be mounted on the first printed circuit board 251 and components for implementing some functions of the first printed circuit board 251 or components for driving the display panel 235 disposed on the fourth surface 222 may be disposed on the second printed circuit board 252. The first printed circuit board 251 and the second printed circuit board 252 may be electrically connected by a flexible printed circuit board 240.

For example, the battery 255 is a device for supplying power to at least one component of the electronic device 101, and may include, for example, a non-rechargeable primary battery, or a rechargeable secondary battery, or a fuel battery. At least a portion of the battery 255 may be disposed on substantially the same plane as the printed circuit board 250. The surfaces of the printed circuit board 250 and the battery 255 formed in substantially the same plane may be disposed on one surface (e.g., a surface facing the second surface 212 and the fourth surface 222 or a surface facing the display panel 235 and the rear plate 290) of the first support member 270 and the second support member 280. For example, the flexible display panel 230 may be disposed on the first surface 211 and the third surface 221, and the printed circuit board 250 and the battery 255 may be disposed on the second surface 212 and the fourth surface 222 facing the surface on which the flexible display panel 230 is disposed.

In an embodiment of the disclosure, the antenna 285 may be disposed between the rear plate 290 and the battery 255. The antenna 285 may include, for example, a near field communication (NFC) antenna, a wireless charging antenna, and/or a magnetic secure transmission (MST) antenna. For example, the antenna 285 may perform short-range communication with an external device or wirelessly transmit and receive power required for charging.

Figure 3A:
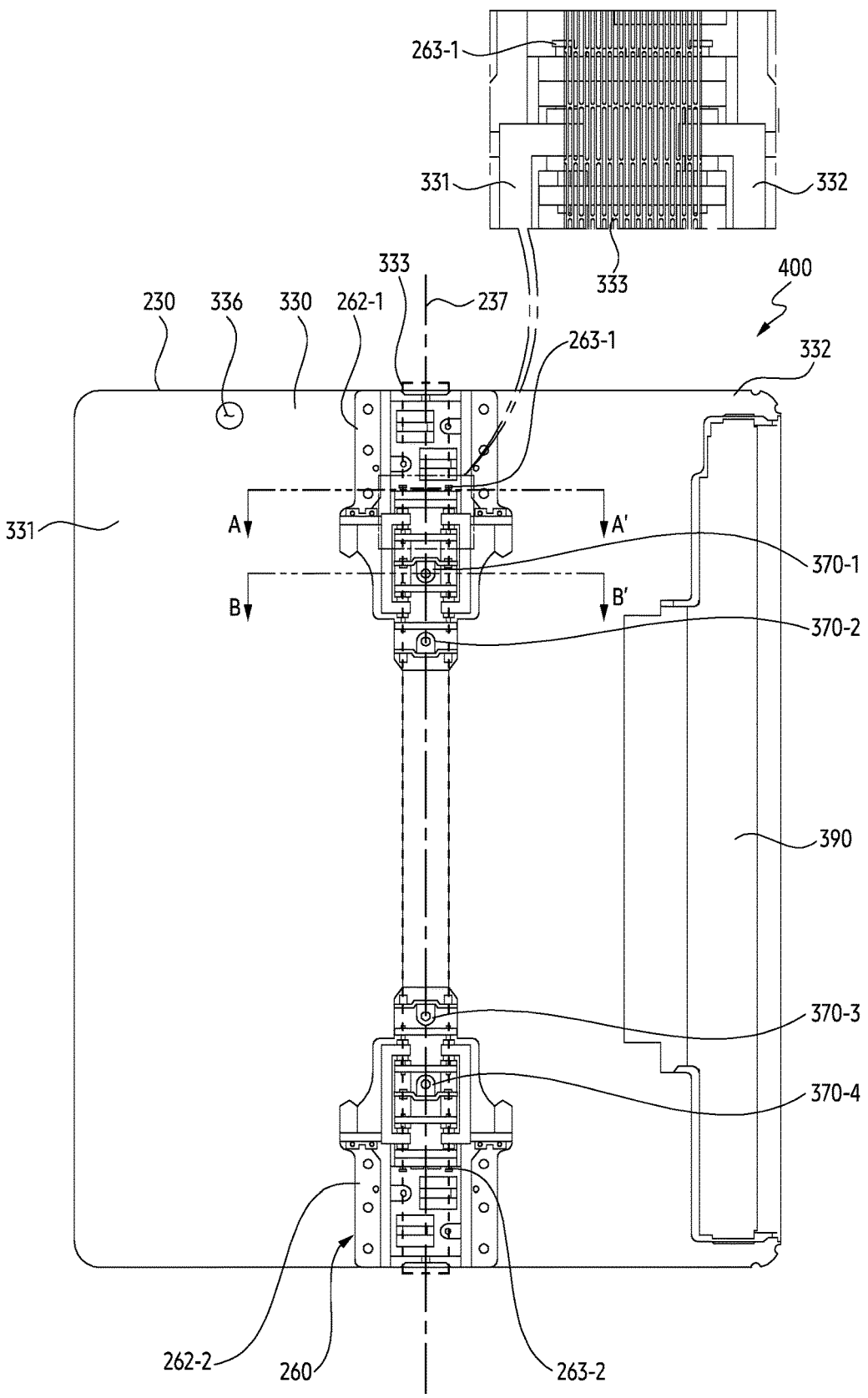
FIGS. 3A and 3B illustrate an arrangement of a display panel and a hinge structure viewed from a rear surface of an electronic device according to various embodiments of the disclosure.
Figure 3B:
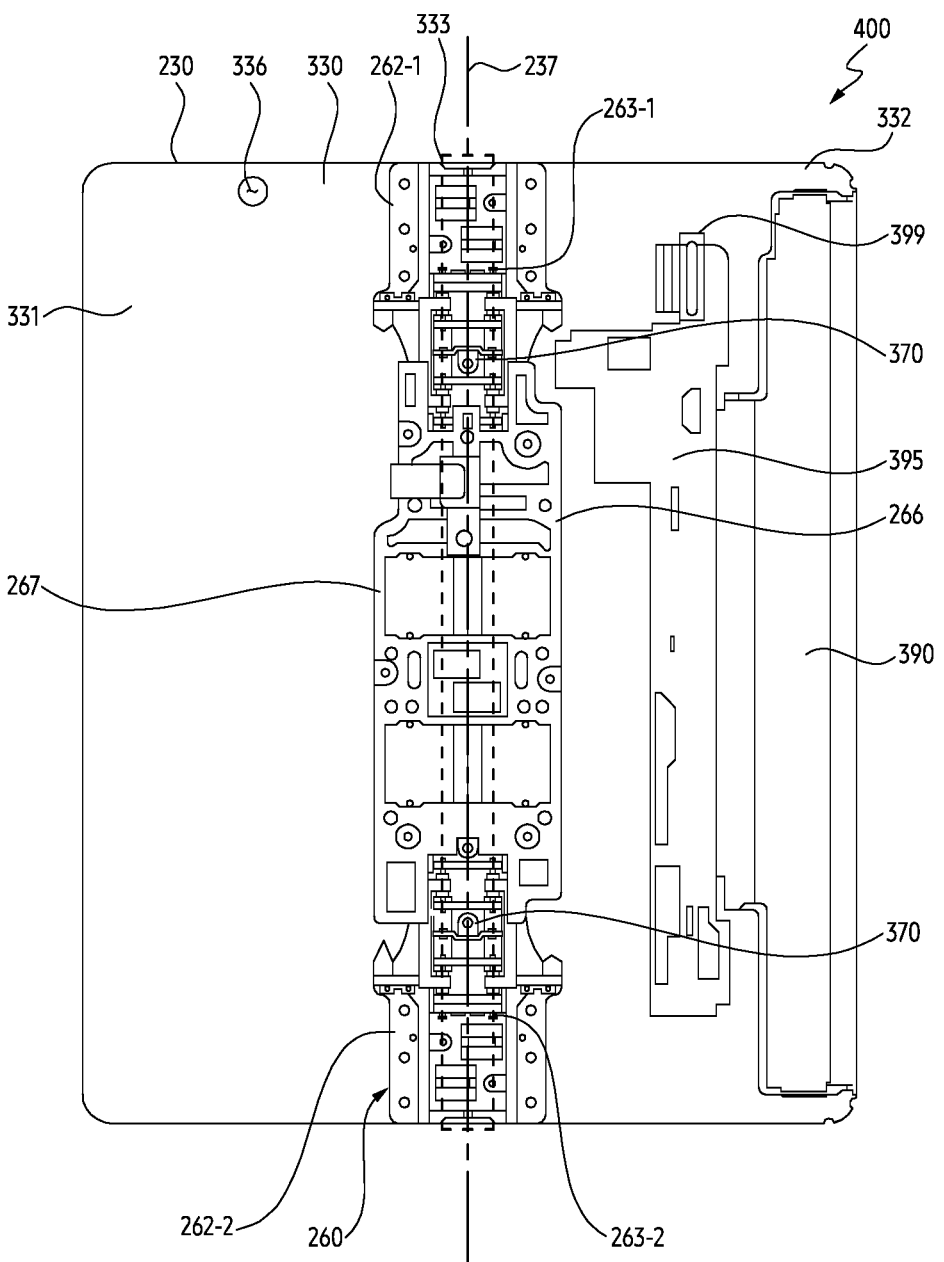

FIGS. 3A and 3B illustrate an arrangement of a display panel and a hinge structure viewed from a rear surface of an electronic device according to various embodiments of the disclosure.

Referring to FIGS. 3A and 3B, a display 400 may include the flexible display panel 230 and the support member 330 corresponding to the shapes of the flexible display panel 230.

According to an embodiment of the disclosure, the flexible display panel 230 may include a rear surface facing a front surface for transmitting visual information to the outside through light emission.

The display 400 may include an extension unit 390 disposed in a manner of folding from the flexible display panel 230 to at least a partial area of the rear surface of the display 400 or the rear surface of the support member 330. The display 400 may be connected to an integrated circuit (e.g., a display driver integrated circuit (DDI) and a touch display driver integrated circuit (TDDI)) through the extension unit 390. According to an embodiment of the disclosure, the extension unit 390 may include a printed circuit board 395 for a flexible display panel 230 extending toward the folding axis 237 and including a connector 399. The printed circuit board 395 for the flexible display panel 230 may be mounted with an integrated circuit including DDI and/or TDDI. The connector 399 may electrically connect the integrated circuit and the printed circuit board 250 (e.g., the second printed circuit board 252).

The extension unit 390 includes an area extending from one periphery of the flexible display panel 230 and a part of the extending area may be bent and extend toward another periphery facing the one periphery of the flexible display panel 230 along the rear surface (e.g., the surface facing the first support member 270 and the second support member 280 of FIG. 2C) of the flexible display panel 230. A part of the area of the extension unit 390 extending toward the other periphery facing the one periphery may be in contact with the rear surface of the display 400 or the rear surface of the support member 330. According to an embodiment of the disclosure, the support member 330 may be disposed on the rear surface of the flexible display panel 230 to support the flexible display panel 230 and protect the flexible display panel 230. The flexible display panel 230 may include at least one layer between the support member 330 and the flexible display panel 230. The at least one layer may include a polymer member, an adhesive layer, a buffer member having an embossed shape, a conductive plate, and the like.

The support member 330 may have substantially the same shape as the external shape of the flexible display panel 230.

However, the disclosure is not limited thereto, and the support member 330 may be formed in another shape of the flexible display panel 230 in some areas. According to an embodiment of the disclosure, the support member 330 and the flexible display panel 230 may further include an opening 336. According to an embodiment of the disclosure, the opening 336 may be formed in the support member 330 among the flexible display panel 230 and the support member 330. An opening 336 may be disposed under the flexible display panel 230, and a camera or sensor may be disposed under the opening. The flexible display panel 230 does not have an opening corresponding to the opening 336, and pixels may be disposed. The camera may be an under display camera (UDC) that is not exposed when viewed from the outside. The support member 330 may reinforce the rigidity of the flexible display panel 230. The support member 330 may be a thin plate-shaped member formed of a metal, fiber reinforced plastic (FRP), or a combination thereof.

For example, the non-metal material or fiber-reinforced plastic of the support member 330 may be a non-metal material, such as carbon fiber reinforced plastic (CFRP) or glass fiber reinforced plastic (GFRP). The metal material of the support member 330 may be a metal material, such as stainless steel (SUS, steel use stainless), Cu, Al, or a metal CLAD (e.g., a member in which SUS and Al are repeatedly stacked). As described above, the support member 330 may be formed of a material having a certain rigidity or more.

According to an embodiment of the disclosure, the support member 330 may include rigid regions 331, 332 and flexible area 333. The rigid regions 331, 332 may include a first rigid region 331 and a second rigid region 332. The first rigid region 331 may face the first display area (e.g., the first display area 231 of FIG. 2A) of the flexible display panel 230, and the second rigid region 332 may face the second display area (e.g., the second display area 232 of FIG. 2A) of the flexible display panel 230. The flexible area 333 may face the third display area (e.g., the second display area 233 of FIG. 2A) of the flexible display panel 230. The first rigid region 331 and the second rigid region 332 may reinforce the rigidity of the first display region 231 and the second display region 232 of the flexible display panel 230 and the flexible area 333 may reinforce the rigidity of the third display area 233 of the flexible display panel 230. The flexible area 333 may be an area corresponding to an area to be bent when the foldable display panel 230 is switched to a folded or unfolded state. When looking at the flexible display panel 230, the flexible region 333 may be formed to overlap at least a part of the hinge structure 260. For example, referring to the enlarged part of the area where the plurality of hinge gears 263-1 are located, the support member 330 may include a flexible region 333 having a shape symmetrical to the folding axis 237 in a region overlapping a plurality of hinge gears 263-1. The flexible region 333 may be disposed to overlap at least a portion of the hinge gears 263-1 and 263-2. The support member 330 may be disposed on the rear surface of the flexible display panel 230 and may be switched to a shape corresponding to the folding state or the unfolded state in response to the switching of the folding state or the unfolded state of the flexible display panel 230. For example, in a folded state, a surface contacting the rear surface of the first rigid region 331 and the flexible display panel 230 may face a surface contacting the rear surface of the second rigid region 332 and the flexible display panel 230. According to an embodiment of the disclosure, in an unfolded state, a direction in which the surface contacting the rear surface of the first rigid region 331 and the flexible display panel 230 may be the same as a direction in which the surface contacting the rear surface of the second rigid region 332 and the flexible display panel 230. The flexible area 333 may be in contact with the third display area 233, and may have flexibility that may be folded together as the third display area 233 is folded. The flexible region 333 may have flexibility than the first rigid region 331 and the second rigid region 332. For example, the flexible region 333 may be formed of a material different from that of the first rigid region 331 and the second rigid region 332, or may have a different structure. The support member 330 may include a plurality of openings to lower the weight and to support the flexible display. A plurality of openings may be disposed in the flexible region 333, and may be disposed in a part of the rigid regions 331, 332 requiring weight reduction. The flexible area 333 may include a plurality of openings having a length in a direction parallel to the folding axis to ensure flexibility.

According to an embodiment of the disclosure, the flexible display panel 230 may be supported by the rigid regions 331, 332 and maintain bending and unfolding characteristics of the third display region 233 due to the flexibility of the flexible region 333.

According to an embodiment of the disclosure, the electronic device 101 may include a hinge structure 260 under an area corresponding to the third display area of the flexible display panel 230. The hinge structure 260 may face the rear surface of the flexible display panel 230 or the support member 330.

The hinge structure 260 may be disposed in an area corresponding to the third display area 233. For example, when the flexible display panel 230 is viewed from above, the third display area 233 may overlap the hinge structure 260.

The hinge structure 260 may switch to an unfolded state in which the first surface (e.g., the first surface 211 of FIG. 2A) of the first housing (e.g., the first housing 210 of FIG. 2A) and the third surface face (e.g., the third surface 221 of FIG. 2A) of the second housing (e.g., the second housing 220 of FIG. 2B) face the same direction, a folded state in which the first surface 211 and the third surface 221 face different direction from each other, or a fully folded state in which the first surface 211 and the third surface 221 face each other.

The hinge structure 260 may include hinge modules 262-1, 262-2. Each of the hinge modules 262-1, 262-2 may be disposed at both periphery of the flexible display panel 230 perpendicular to the folding axis 237. Each of the hinge modules 262-1, 262-2 may include a plurality of hinge gears 263-1, 263-2. For example, the flexible display panel 230 may include an upper periphery and a lower periphery facing the upper periphery, which are close to the opening 336 and perpendicular to the folding axis 237 and the first hinge module 262-1 may be disposed at the upper periphery of the flexible display panel 230. The second hinge module 262-2 may be disposed at the lower periphery of the flexible display panel 230. The first hinge module 262-1 may include a first plurality of hinge gears 263-1, and the second hinge module 262-2 may include a second plurality of hinge gears 263-2. The first plurality of hinge gears 263-1 may be disposed to be engaged with each other in a direction perpendicular to the folding axis 237 to form the first hinge module 262-1 and the second plurality of hinge gears 263-2 may be disposed to be engaged with each other in a direction perpendicular to the folding axis 237 to form the second hinge module 262-2.

The hinge structure 260 may further include fastening members 370-1, 370-2, 370-3, and 370-4. The fastening members 370-1, 370-2, 370-3, and 370-4 may fasten the hinge modules 262-1, 262-2 to the hinge cover 265 or other components of the hinge structure 260. The fastening members 370-1, 370-2, 370-3, and 370-4 may be spaced apart from each other along the folding axis. For example, the first fastening member 370-1 and the second fastening member 370-2 may be spaced apart from each other and may be disposed closer to the first hinge module 262-1 than the third fastening member 370-3 and the fourth fastening member 370-4. The first hinge module 262-1 may be disposed between the upper periphery of the flexible display panel 230 and the first fastening member 370-1. The second fastening members 370-2 may be spaced apart along the first fastening member 370-1 and the folding axis.

The third fastening member 370-3 and the fourth fastening member 370-4 may be spaced apart from each other, and may be disposed closer to the second hinge module 262-2 than the first fastening member 370-1 and the second fastening member 370-2. The second hinge module 262-2 may be disposed between the lower periphery of the flexible display panel 230 and the fourth fastening member 370-2.

According to the above-described embodiment of the disclosure, the electronic device 101 may switch the flexible display panel 230 to a folded state or an unfolded state by the hinge structure 260, and may include a support member 330 to reinforce the rigidity of the flexible display panel 230. The flexible region of the support member 330 may include a pattern structure different from that of the rigid regions 331 and 332 to ensure flexibility of the flexible region corresponding to the third region 233 of the flexible display panel 230. For example, the rigid regions 331 and 332 may be formed in a plane without a separate opening or pattern, and the flexible region 333 may be formed to include a plurality of openings repeatedly disposed.

Figure 4A:
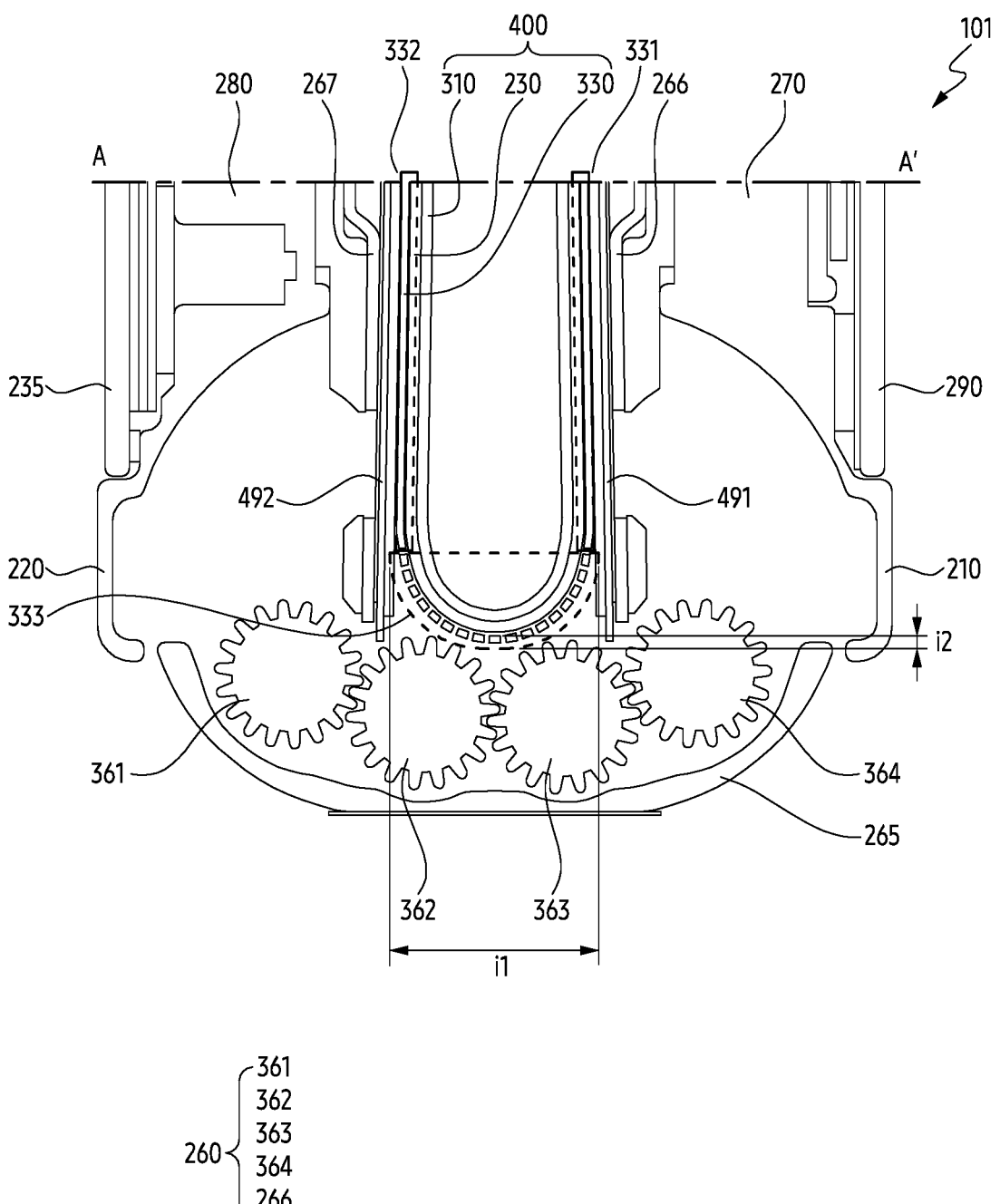
FIG. 4A is a sectional view of A-A' of FIG. 3A in a folded state of an electronic device according to an embodiment of the disclosure.

FIG. 4A is a section view of A-A' of FIG. 3A in a folded state of an electronic device according to an embodiment of the disclosure.

Figure 4B:
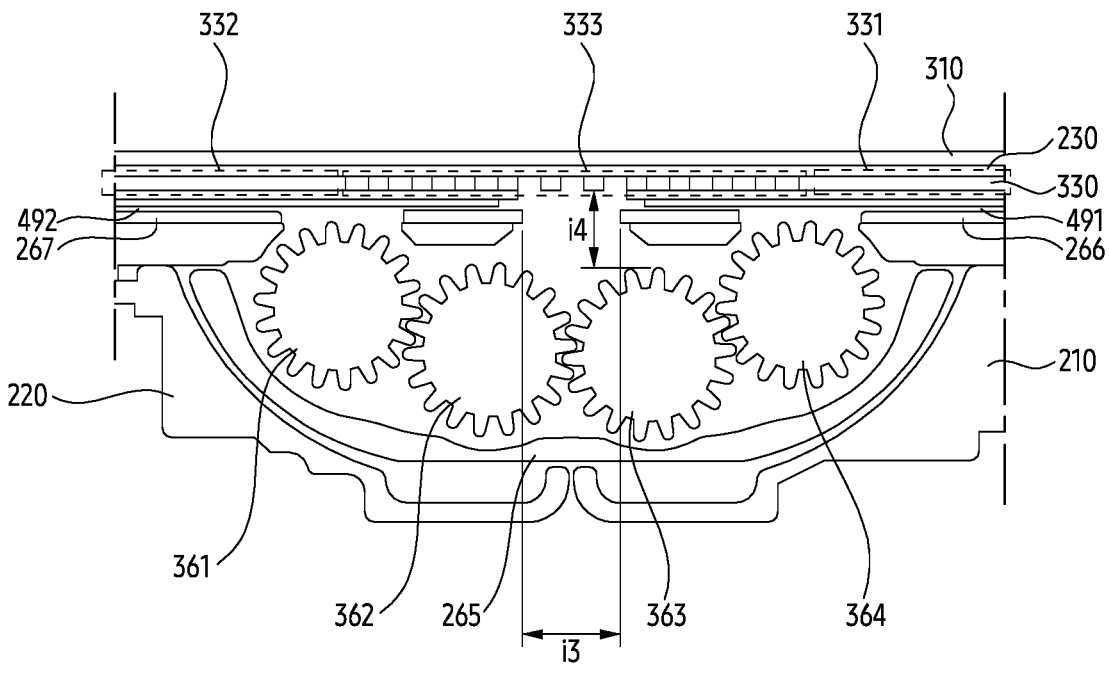
FIG. 4B is a section view taken along line A-A' of FIG. 3A in an unfolded state of an electronic device according to an embodiment of the disclosure.

FIG. 4B is a section view taken along line A-A' of FIG. 3A in an unfolded state of an electronic device according to an embodiment of the disclosure.

Referring to FIGS. 4A and 4B, the electronic device 101 may include a flexible display 400, a first support member 270, a second support member 280, and a hinge structure 260.

The flexible display 400 may include a flexible display panel 230, a protection layer 310, a support member 330, and/or reinforcing members 491 and 492. The first hinge plate 266 may support the first reinforcing member 491, and the second hinge plate 267 may support the second reinforcing member 492. The reinforcing members 491 and 492 may be formed of a metal material. For example, the reinforcing members 491 and 492 may be formed of stainless steel (SUS) or aluminum. The reinforcing members 491 and 492 may support the support member 330 and the flexible display panel 230 to reinforce the rigidity of the support member 330 and the flexible display panel 230.

The support member 330 may be disposed on the first reinforcing member 491 and the second reinforcing member 492, the flexible display panel 230 may be disposed on the support member 330, and the protective layer 310 may be disposed on the flexible display panel 230.

The protection layer 310 may be formed of a transparent material, and may transmit light emitted from the flexible display panel 230 to the outside. For example, the flexible display panel 230 may transmit light representing visual information through the protection layer 310 to the outside. According to an embodiment of the disclosure, the protection layer 310 may protect the surface of the flexible display panel 230. The material of the protection layer 310 may be a glass material, such as ultra-thin glass (UTG) or a polymer material, such as polyimide (PI).

The flexible display panel 230 may be disposed on one surface of the first housing (e.g., the first housing 210 of FIG. 2A) and the second housing (e.g., the second housing 220 of FIG. 2A). The first housing 210 may include a part of the flexible display panel 230 (e.g., a part of the first display area 231 and the third display area 233), a rear plate 290, and a first support member 270. The second housing 220 may include a part of the flexible display panel 230 (e.g., a part of the second display area 232 and the third display area 233), a display panel 235, and a second support member 280. The first housing 210 and the second housing 220 may include a flexible display panel 230, a rear plate 290, a plurality of side surfaces (e.g., the first side surface 213 and the side surface 223 of FIG. 2A), and an inner space surrounded by the display panel 235.

The support member 330 may be in contact with the rear surface of the flexible display panel 230 (e.g., a surface facing the hinge cover 265 or a surface in contact with the hinge plates 266 and 267). The support member 330 may include rigid regions 331, 332 supporting the first display region 231 and the second display region 232 and a flexible area 333 that mainly supports the third display area 233 and supports a portion of the first display area 231 and a portion of the second display area 232.

The hinge cover 265 may be disposed in the inner space and covered by the first housing 210 and the second housing 220 in an unfolded state. The hinge cover 265 may be exposed to the outside of the electronic device 101 according to the movement of the first housing 210 and the second housing 220 in a folded state. The hinge cover 265 may accommodate the hinge structure 260 therein and protect components of the hinge structure 260. The hinge structure 260 may include a plurality of gears 361, 362, 363, and 364, a first hinge plate 266, and a second hinge plate 267. A plurality of gears 361, 362, 363, and 364 may rotate the first hinge plate 266 and the second hinge plate 267 while being engaged with each other to switch the electronic device 101 to a folded state or an unfolded state. The first hinge plate 266 and the second hinge plate 267 may be connected to a hinge module (e.g., the hinge module 262 of FIG. 2C or the hinge module 262 of FIG. 2D). The hinge module 262 may include a plurality of gears 361, 362, 363, and 364, and may rotate the first hinge plate 266 and the second hinge plate 267 by rotation of the plurality of gears. The hinge module 262 may be fastened to the hinge cover 265 by a screw 370.

The support member 330 is disposed in a direction toward the hinge structure 260, and an area exposed toward the hinge structure 260 may vary in a folded state or an unfolded state of the electronic device.

Referring to FIG. 4A, in a folded state, the flexible region 333 of the support member 330 may be exposed to a hinge structure 260. For example, the flexible region 333 of the support member 330 may be exposed toward at least one (e.g., gear 362 and/or gear 363) of a plurality of gears 361, 362, 363, and 364 included in the hinge structure 260 through an interval i1 between the first hinge plate 266 and the second hinge plate 267.

The first hinge plate 266 and the second hinge plate 267 may face each other in a folded state and the interval i1 between the first hinge plate 266 and the second hinge plate 267 may be narrower than the interval between the first hinge plate 266 and the second hinge plate 267 in the unfolded state or in the transitional state transitioning from the unfolded state to the folded state.

The interval i2 between the flexible region 333 and the plurality of gears 361, 362, 363, and 364 may be designed to be greater than at least a distance for preventing interference between the plurality of gears 361, 362, 363, 364 and the support member 330 and the hinge plates 266, 267.

In the unfolded state as shown in FIG. 4B, at least a part of the flexible region 333 of the support member 330 may be covered by hinge plates 266 and 267 of the hinge structure 260. The flexible region 333 may be exposed to a plurality of gears 361, 362, 363, and 364 through an interval i3 between the first hinge plate 266 and the second hinge plate 267.

In the unfolded state, directions toward the flexible display panel 230 of the first hinge plate 266 and the second hinge plate 267 may be the same. For example, a surface facing the first hinge plate 266 and a surface facing the second hinge plate 267 may be the same in order to make the direction in which the first surface 211 of the first housing 210 faces and the direction in which the second surface 212 face is the same.

The interval i4 between the flexible region 333 of the support member 330 and the plurality of gears 361, 362, 363, and 364 may be greater than the interval between the hinge plates 266 and 267 and the plurality of gears, so that the support member 330 may be protected by the first hinge plate 266 and the second hinge plate 267.

Each of the first rigid region 331 and the second rigid region 332 of the support member 330 may be attached to each of the first hinge plate 266 and the second hinge plate 267, and may be not exposed to a plurality of gears 361, 362, 363, and 364, and may be covered by the first hinge plate 266 and the second hinge plate 267. one region of flexible region including a periphery close to the boundary between the first rigid area 331 and the flexible area 333 and another region of flexible region 333 including another periphery close to the boundary between the second rigid area 332 and the flexible area 333 may be attached to the first hinge plate 266 and the second hinge plate 267, and may not be exposed to the outside even when switching to a folding state or an unfolded state. According to an embodiment of the disclosure, a region of the flexible region 333 including a folding axis and including a bent section when switching to a folding state or an unfolded state may be exposed to the outside when switching to a folding state or an unfolded state.

According to an embodiment of the disclosure, one surface of the first reinforcing member 491 may be attached to the first hinge plate 266, and the other surface of the second reinforcing member 492 may be attached to the second hinge plate 267. The other surface distinguished from one surface of the first reinforcing member 491 and the other surface distinguished from one surface of the second reinforcing member 492 may be attached to at least a part of the support member 330. For example, each of the first reinforcing member 491 and the second reinforcing member 492 may be attached to each of the first rigid region 331 and the second rigid region 332. The flexible region 333 may not be attached to the first reinforcing member 491 and the second reinforcing member 492. However, the disclosure is not limited thereto, and a portion including the flexible region 333 and a boundary of the first rigid region 331 and the second rigid region 332 may be attached to a portion of the first reinforcing member 491 and the second reinforcing member 492.

The first reinforcing member 491 and the second reinforcing member 492 may cover at least a portion of the flexible region 333 in an unfolded state. For example, the first reinforcing member 491 and the second reinforcing member 492 may be disposed on the same plane, and the first reinforcing member 491 and the second reinforcing member 492 may face each other at intervals.

When switching from an unfolded state to a folded state, the first reinforcing member 491 and the second reinforcing member 492 may pivot according to motion of the first hinge plate 266 and the second hinge plate 267. As the folding state is switched, the distance between the first reinforcing member 491 and the second reinforcing member 492 may be increased. When switching from unfolded state to folded state, the distance between the facing corners of the first reinforcing member 491 and the second reinforcing member 492 may be widened by rotation. According to an embodiment of the disclosure, as the folding state is switched, the flexible region 333 covered by the first reinforcing member 491 and the second reinforcing member 492 may be exposed toward the hinge module 262.

According to an embodiment of the disclosure, the first hinge plate 266 and the second hinge plate 267 may be rotated by a plurality of gears 361, 362, 363, and 364 included in the hinge module 262. By rotation of the first hinge plate 266 and the second hinge plate 267, the first reinforcing member 491 and the second reinforcing member 492 may rotate with respect to the folding axis 237, and adjust an area in which the flexible region 333 is exposed to the hinge module 262. An area in which the flexible region 333 is exposed toward the hinge module 262 may be related to an interval between the first hinge plate 266 and the second hinge plate 267 and/or the first reinforcing member 491 and the second reinforcing member 492. The interval i1 between the first hinge plate 266 and the second hinge plate 267 in the folded state may be greater than the interval i3 between the first hinge plate 266 and the second hinge plate 267 in the unfolded state. For example, an area in which the flexible region 333 is covered by the first hinge plate 266 and the second hinge plate 267 in a folded state may be smaller than an area in which the flexible region 333 is covered by the first hinge plate 266 and the second hinge plate 267 in an unfolded state. An area in which the flexible area 333 is exposed toward the plurality of gears 361, 362, 363, and 364 of the hinge structure 260 in the folded state may be larger than an area in which the flexible area 333 is exposed toward the plurality of gears 361, 362, 363, and 364 in the unfolded state.

According to an embodiment of the disclosure, in the unfolded state, the interval i4 between the flexible region 333 and the plurality of gears may be longer than the interval i2 between the flexible region 333 and the plurality of gears in the folded state. In a folded state, due to an increase in the exposed area of the flexible region 333 and a decrease in the distance between the plurality of gears 361, 362, 363, and 364, interference between the hinge plates 266, 267 or the flexible area 333 and a plurality of gears 361, 362, 363, 364 is more likely to occur due to external impact or movement of the gear. According to an embodiment of the disclosure, a plurality of gears 361, 362, 363, and 364 of the hinge structure 260 may be exposed to the flexible region 333 by the expansion of the interval i1 or i3 according to the transition from the unfolded state of the electronic device 101 to the folded state. In the folded state, since a plurality of gears 361, 362, 363, and 364 may directly face the flexible region 333, the possibility of damage to the support member 330 may increase.

When contact occurs between the flexible region 333 and a plurality of gears 361, 362, 363, and 364, the flexible area 333 may be damaged, and the flexible display panel 230 may be damaged due to the breakage of the flexible area 333. Through various transformation of the opening pattern formed in the flexible region 333, the flexible region 333 may prevent interference that may occur between a plurality of gears 361, 362, 363, and 364.

Figure 5A:
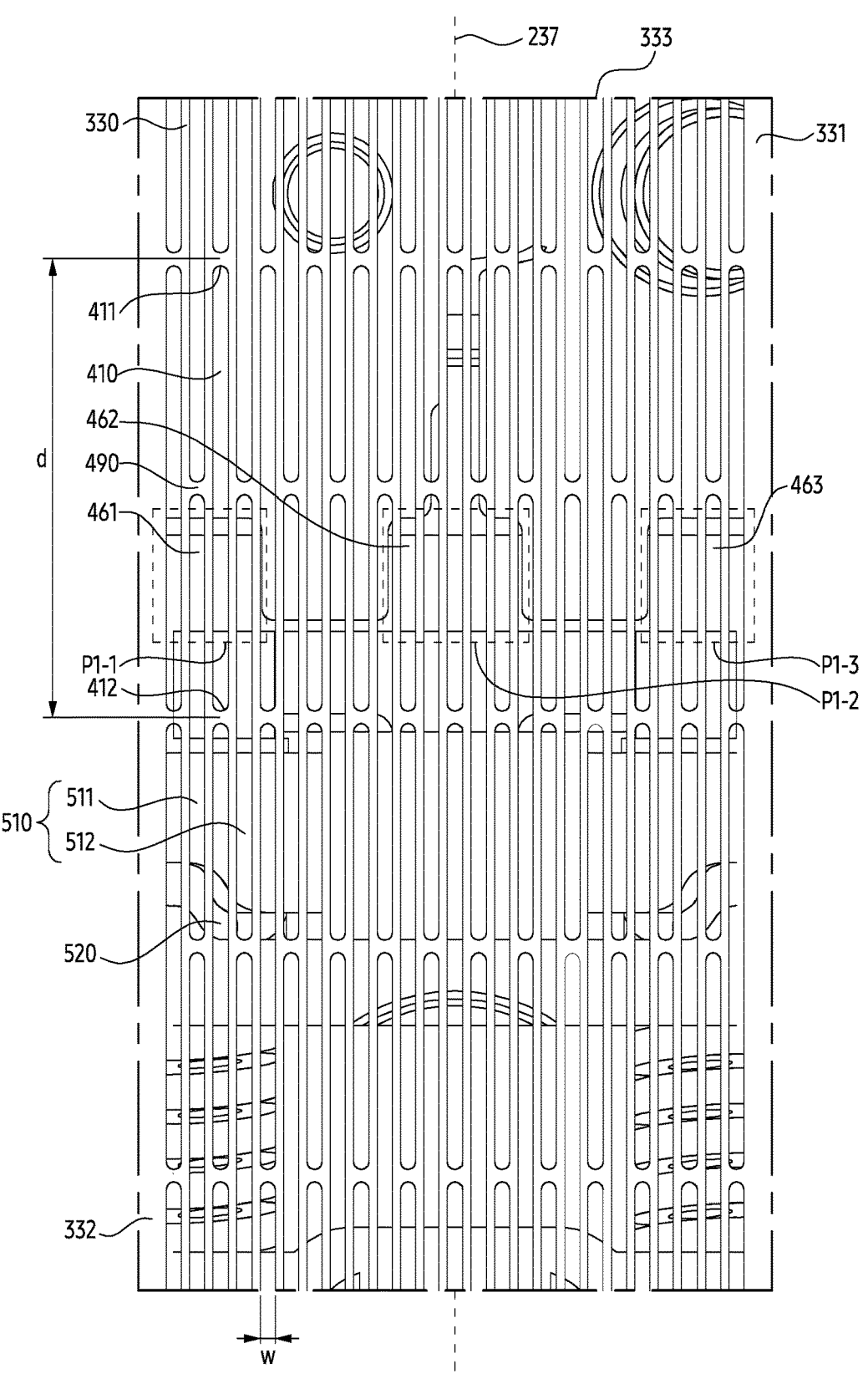
FIGS. 5A, 5B, and 5C show a relationship between a shape of a support member and a hinge structure according to various embodiments of the disclosure.
Figure 5B:
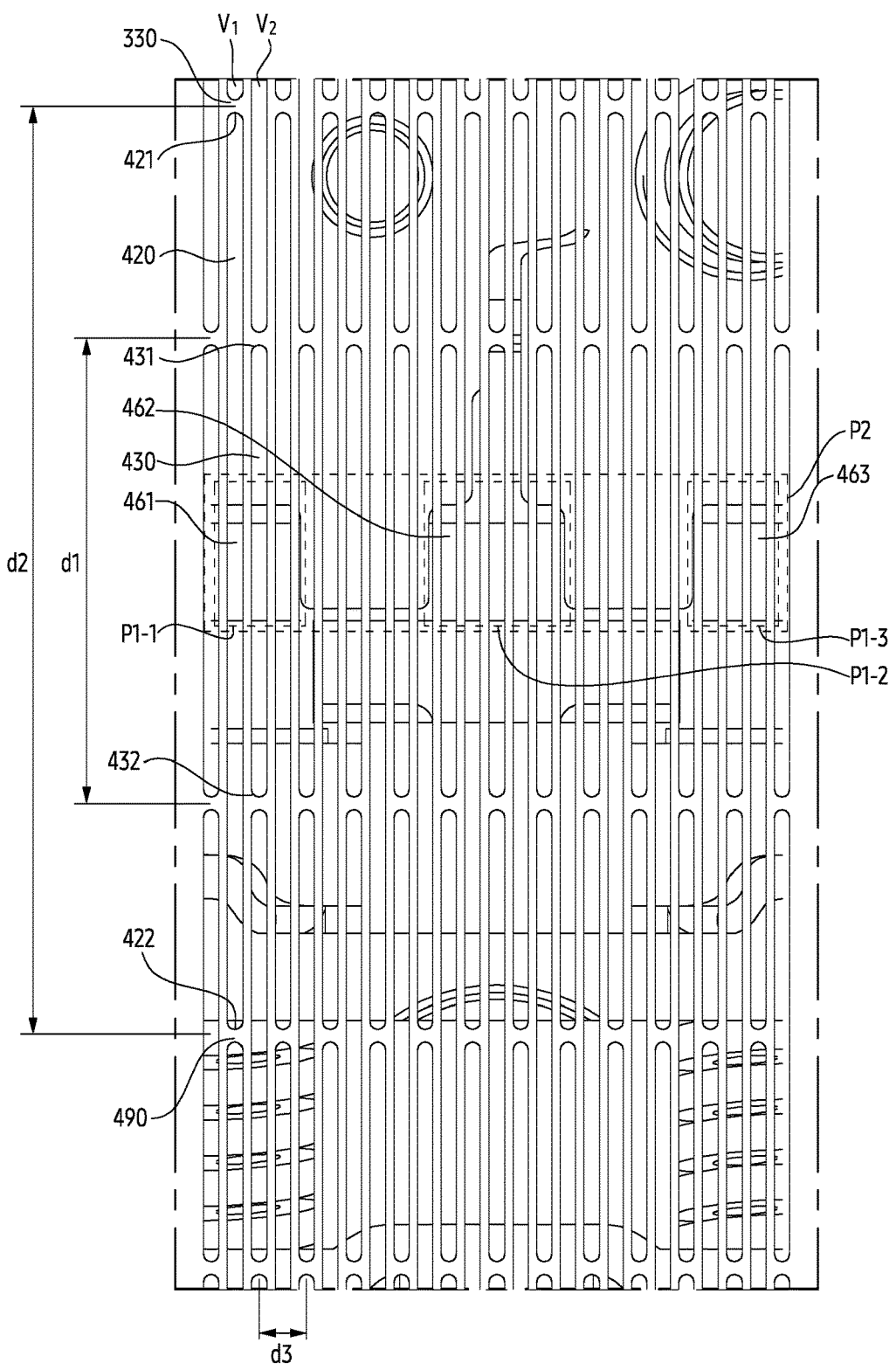
Figure 5C:
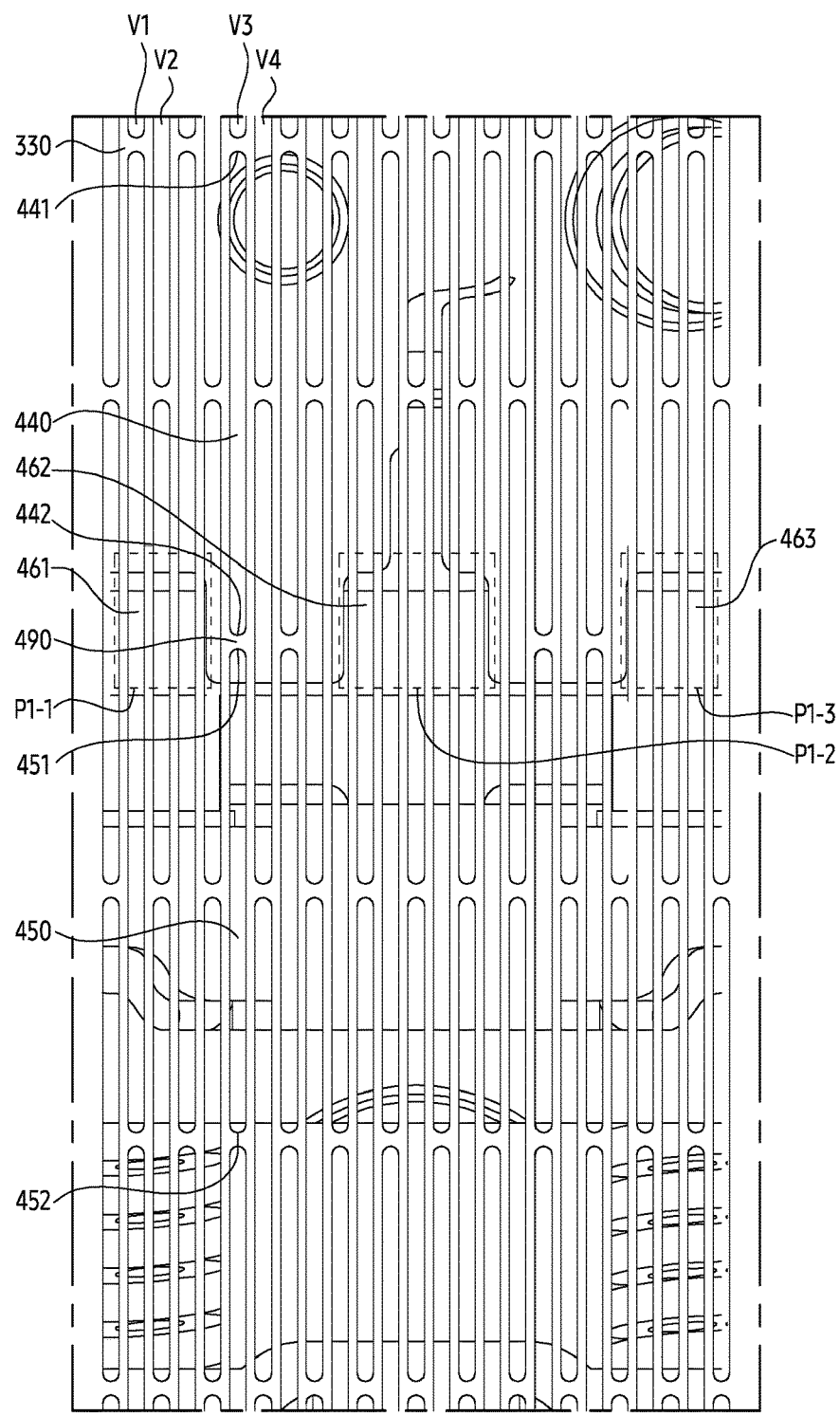

FIGS. 5A, 5B, and 5C illustrate a relationship between a shape of a support member and a hinge structure according to various embodiments of the disclosure.

Referring to FIG. 5A, the flexible region 333 may include regions P1-1 and P1-3, in which gears 461 and 463 partially overlap the flexible region 333 among a plurality of gears and include a region P1-2 in which gears 462 completely overlapping the flexible region 333 are located among a plurality of gears. For example, a portion of each of the gears 461, 463 may overlap the flexible region 333, and the remainder may overlap the rigid regions 331, 332.

The support member 330 may include a plurality of openings 410 in the flexible region 333. A plurality of openings 410 may be formed to have a length (d) in a direction parallel to the folding axis. A plurality of openings 410 may be formed with a width (w) in a direction perpendicular to the folding axis. When the electronic device is switched to a folded or unfolded state, for transformation in a direction perpendicular to the folding axis, a plurality of openings 410 may have a length (d) longer than a width (w). A plurality of openings 410 may include first openings 510 disposed in a direction perpendicular to a folding axis (e.g., the folding axis 237 of FIG. 2A) and second openings 520 disposed between the first openings 510. For example, the first openings 510 may include an opening 511 and an opening 512. One of the second openings 520 may be disposed between the opening 511 and the opening 512. The second openings 520 disposed between the first openings 510 are long-hole openings having the same length, but positions of ends may be different. For example, one of the ends of the second opening 520 may be disposed between the opening 511 and the opening 512 of the first openings 510. The second openings 520 may be disposed between the first openings 510 disposed in a direction perpendicular to the folding axis 237, and the second openings 520 may be alternately disposed in the same shape in a vertical direction. The second openings 520 may be rectangular openings having a length different from that of the first openings 510, and the length may be longer than the widths (w) of the openings 410.

The second openings 520 may include openings respectively extending in a first direction (e.g., a direction toward an upper periphery perpendicular to the folding axis 267 among edges of the support member 330) parallel to the folding axis from a portion of the space between the first openings 510 and include openings extending in a direction (e.g., a direction toward a lower periphery perpendicular to the folding axis 267 among edges of the support member 330) opposite to the first direction from another portion of the space spaced apart along a direction opposite to the first direction and disposed in a direction perpendicular to the folding axis.

In the flexible region 333, the support member 330 may include a plurality of openings 410 and connection part 490 disposed at both ends 411 and 412. The connection part 490 may be a frame disposed between a plurality of openings 410. The connection part 490 may reinforce the horizontal rigidity of the support member 330.

According to an embodiment of the disclosure, in order to prevent interference with gears 461, 462, and 463 exposed to the support member 330 among a plurality of gears, the pattern formed by a plurality of openings 410 may be aligned with respect to a plurality of gears 461, 462, and 463. For example, the pattern may be arranged so that the connection part 490, which is the horizontal frame 493, is not disposed in the regions P1-1, P1-2, and P1-3 in which the plurality of gears is located. According to an embodiment of the disclosure, the connection part 490 connecting the openings may be disposed not to overlap the gears 461, 462, and 463 in order to reduce contact between the supporting member 330 and the teeth of the gears 461, 462, 463 exposed to the flexible area 333 of the support member 330 among the plurality of gears.

According to the above-described embodiment of the disclosure, the support member 330 may be disposed so that the connection portion 490 remaining after the plurality of openings 410 is formed does not overlap with the gears 461, 462, 463 exposed toward the support member 330 among the plurality of gears and may prevent damage due to an external impact or shaking of the electronic device 101 of FIG. 1 in a folded state. As damage to the support member 330 is prevented, damage to the flexible display panel 230 supported by the support member 330 may be prevented Referring to FIG. 5B, a plurality of openings 420 may have arrangements similar to those of a plurality of openings 410 in FIG. 4A, and may have different arrangements in some areas. Patterns of a plurality of openings 420 may have different patterns around regions P1-1, P1-2, and P1-3, in which a plurality of gears 461, 462, and 463 exposed to the support member 330 are located.

As shown in FIG. 5A, when the plurality of openings has the same length (d) and are not aligned without including the connection part 490 in a region overlapping the plurality of gears, at least one connection part 490 may be removed from a region overlapping a plurality of gears.

The support member 330 may include regions P1-1, P1-2, and P1-3, in which a plurality of gears 461, 462, and 463 are located, and may not include a connection part 490 in a region P2 surrounding the regions P1-1, P1-2, and P1-3.

Among the openings overlapping the regions P2 including regions P1-1, P1-2, and P1-3, the length d2 of the opening 420 disposed in the column V1 and the length d1 of the opening 430 disposed in the column V2 adjacent to the column V1 may be different from each other. According to one embodiment of the disclosure, openings overlapping the region P2 may be alternately disposed with openings having length d1 and openings having length d2 along a direction perpendicular to the folding axis.

In the region P2, the openings 420 from which at least one connection part 490 is removed may be disposed in a first direction perpendicular to the folding axis, and the openings 430 from which the connection part 490 is not removed may be disposed between the openings 420.

The opening 420 formed by removing at least one connection part 490 may have a length longer than that of the opening 430 to which the connection part 490 is not removed. For example, the length of the opening 430 from which the connection part 490 is not removed may be d1, and the length of the opening 420 from which at least one connection part 490 is removed may be d2. Since the length d2 is a combined length of the two openings, it may be twice the length d1.

According to an embodiment of the disclosure, openings that do not overlap the region P2 may be formed with an equally spaced length d1. For example, openings disposed at both ends of the openings 420 and 430 overlapping the region P2 may be disposed with a length d1. The connection parts 490 may be spaced apart from each other by a length d3 at equal intervals perpendicular to the folding axis in an area other than the area P2.

Referring to FIG. 5C, unlike FIG. 5B, the connection part 490 of the support member 330 may be removed only in the regions P1-1, P1-2, and P1-3 among a plurality of openings. For example, one end of some of the openings 450 among the openings located between the regions P1-1, P1-2, and P1-3 in which the plurality of gears 461, 462, 463 may be disposed between region P1-1, P1-2, P1-3. The support member 330 may include at least one connection part 490 between regions P1-1, P1-2, and P1-3 in which a plurality of gears 461, 462, and 463 are disposed.

According to an embodiment of the disclosure, openings that do not overlap the regions p1-1, p1-2, and p1-3 may have the same length. For example, as shown in FIG. 5B, among the openings overlapping the regions p1-1, p1-2, and p1-3, the lengths of the openings disposed in column V1 and the lengths of the openings disposed in column V2 contacting column V1 may be different from each other, but among the openings located between the regions p1-1, p1-2, and p1-3, the lengths of the openings disposed in column V3 and the openings disposed in column V4 may be the same.

According to the above-described embodiment of the disclosure, the support member 330 may prevent interference between the gear teeth of a plurality of gears 461, 462, and 463 and the pattern of the support member 330 in the area where the plurality of gears 461, 462, 463 are exposed, by avoiding the ends of the openings or by removing the connection. Since the distance between the plurality of gears 461, 462, and 463 and the flexible display panel 230 is close while the electronic device 101 including the flexible display panel 230 is folded, damage to the flexible display panel 230 or the support member 330 may occur due to small impact or shock from shaking. The pattern of the support member 330 may prevent interference with a plurality of gears 461, 462, and 463 exposed to the outside, thereby preventing damage and protecting the flexible display panel 230.

Figure 6:
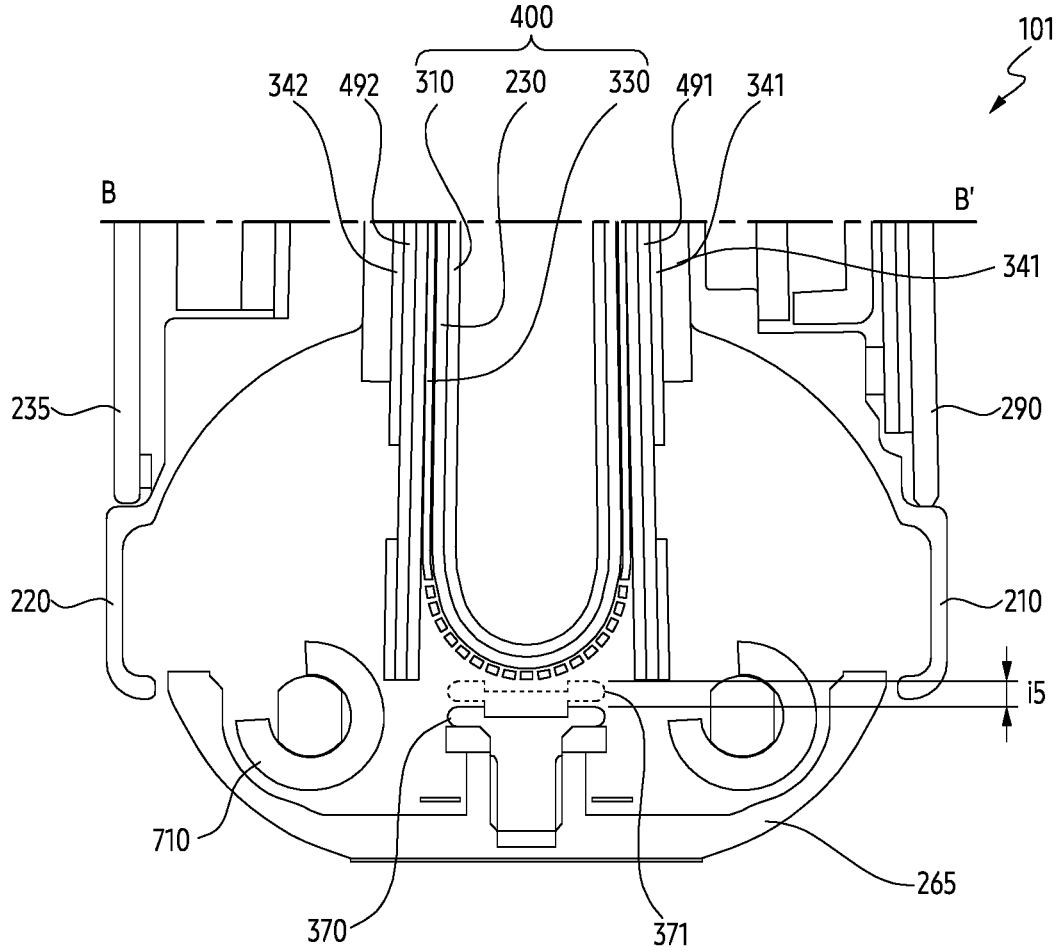
FIG. 6 is a section view taken along line B-B' of FIG. 3A in a folded state of an electronic device according to an embodiment of the disclosure.

FIG. 6 is a section view taken along line B-B' of FIG. 3A in a folded state of an electronic device according to an embodiment of the disclosure.

Referring to FIG. 6, the electronic device 101 may include a flexible display 400, a first housing 210, a second housing 220, and a screw 370.

The flexible display 400 may include a flexible display panel 230, a protection layer 310, and/or a support member 330. The support member 330 may be supported by a first hinge plate 341 coupled to the first housing 210 and a second hinge plate 342 coupled to the second housing 220. The protection layer 310 capable of protecting the flexible display panel 230 may include a glass material, such as ultra-thin glass (UTG) or a polymer material, such as polyimide (PI).

The electronic device 101 may include an inner space surrounded by the first housing 210, the second housing 220, the flexible display panel 230, and the hinge cover 265. The screw 370 in the inner space may couple the hinge cover 265 and a hinge structure (e.g., the hinge structure 260 of FIG. 2C). Power transmission members 716 may be disposed on both side surfaces of the screw 370. The power transmission member 716 may receive rotational motion by rotation of a plurality of gears and transmit rotational force to the hinge plates 341 and 342.

According to an embodiment of the disclosure, the screw 370 may couple the hinge module (e.g., the hinge module 262 of FIG. 2D) and the hinge cover 265. Through coupling of the hinge module 262 with the hinge cover, hinge plates (e.g., hinge plates 266 and 267 of FIG. 2D) may be fixed to the hinge cover 265. The screw 370 may be normally fastened to the hinge cover 265 to couple the hinge structure 260. In the abnormal case, the screw 371 may be less inserted into the hinge cover 265, or may protrude toward the support member 330 when assembled to deviate from the insertion direction. The screw 371 protruding toward the support member 330 may damage the support member 330 by an external impact. According to an embodiment of the disclosure, when the electronic device 101 is switched to a folded state or an unfolded state, interference may occur between the screw 371, the support member 330, and the flexible display panel 230.

According to an embodiment of the disclosure, in the folded state as shown in FIG. 6, since the interval i5 between the abnormally fastened screw 371 and the support member 330 is short, when a force is applied to the electronic device 101 from the outside, an impact by the abnormally fastened screw 371 may be transmitted to the support member 330. The support member 330 may have a pattern including an opening to prevent interference with the abnormally fastened screw 371.

Figure 7A:
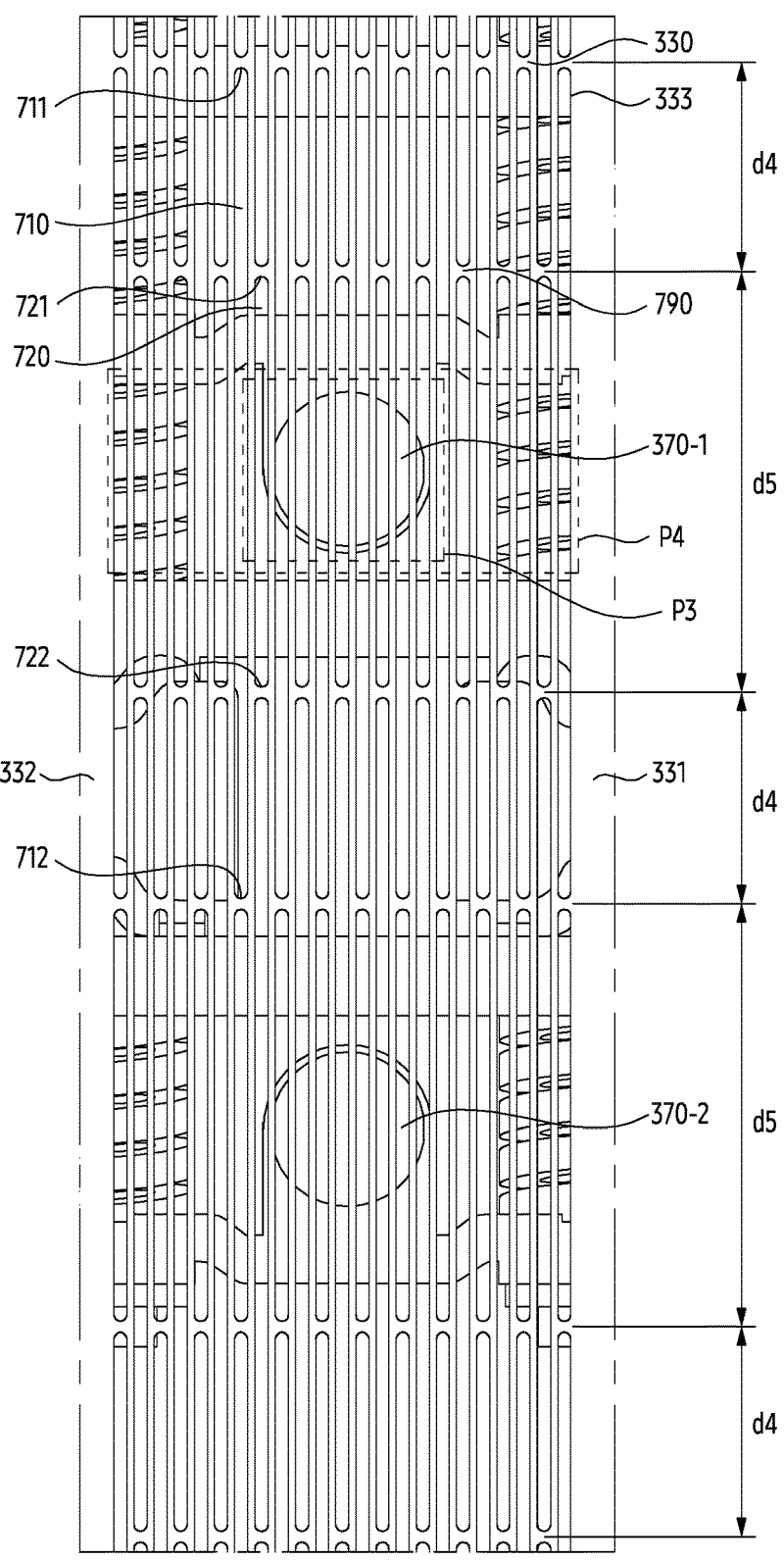
FIGS. 7A and 7B show a shape of a support member and show a relationship between a support member and a hinge screw according to various embodiments of the disclosure.
Figure 7B:
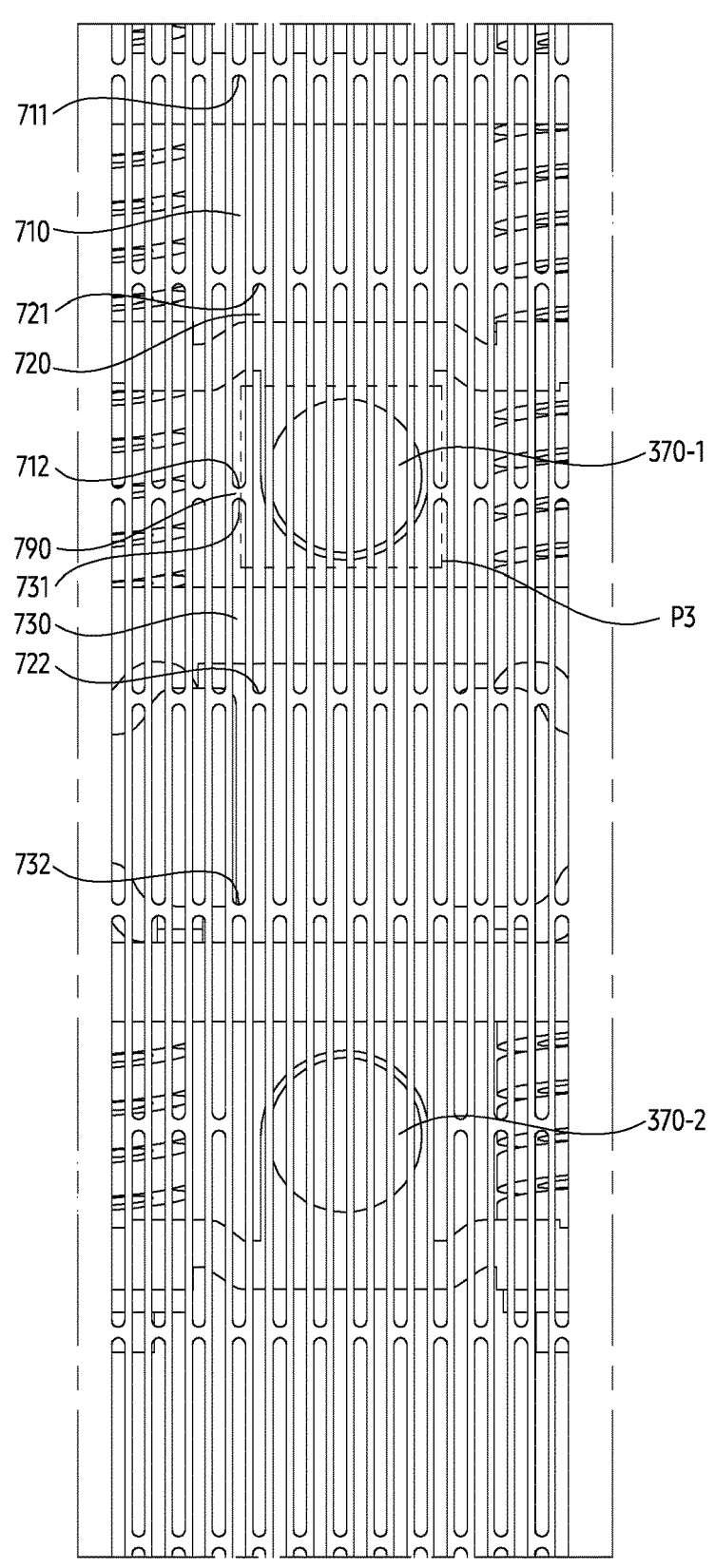

FIGS. 7A and 7B show a shape of a support member and show a relationship between a support member and a hinge screw according to various embodiments of the disclosure.

Referring to FIGS. 7A and 7B, in the region P3 where the screws 370-1, 370-2 are located, the connection parts 790, 731, 730, and 732 perpendicular to the folding axis may not be included.

A plurality of openings 710 may have an arrangement similar to that of the plurality of openings 410 of FIG. 5A. The patterns of the plurality of openings 710 may have different patterns around the area P4 in which the screws 370-1 and 370-2 exposed to the support member 330 are located.

According to an embodiment of the disclosure, the support member 330 may remove at least one connection part 790 from the region P3 where the screws 370-1, 370-2 overlap.

Referring to FIG. 7A, the support member 330 may remove at least one connection part 790 from the region P4 surrounding the region P3 where the screws 370-1 and 370-2 are located. The openings overlapping the area P4 may include openings of different lengths. For example, the opening 710 may extend from one end 711 to the other end 712 to twice the length d5. The opening 720 adjacent to the opening 710 may extend to a length d5 from one end 721 to the other end 722.

Among the openings overlapping the region P4, the opening 710 may be a rectangular opening having a length twice that of the length d5 by removing the connection part 790. Among the openings overlapping the region P4, the opening 720 may be a rectangular opening having a length d5 since the connection part 790 is not removed. According to an embodiment of the disclosure, openings overlapping the region P4 may be alternately disposed with openings having a length d5 and openings having twice the length of the length d5 along a direction perpendicular to the folding axis.

For example, in the region P4, the openings 710 from which at least one connection part 790 is removed may be disposed between the openings 720 from which the connection part 790 is not removed.

According to an embodiment of the disclosure, an opening that does not overlap the region P4 may be formed to have a length d5 equal to each other. For example, openings disposed at both ends of the openings 710 and 720 overlapping the region P4 may be disposed with a length d5. In an area other than the area P4, the connection portions 790 may be spaced apart from each other at equal intervals (e.g., length d3 of FIG. 4A) along the folding axis. At least one connection part 790 in contact with the opening overlapping the region P4 may be spaced apart by a distance d5 while facing the other connection part in the folding axis direction. The connection part 790 may be disposed at an end of the opening. For example, the connection part may be disposed at one end 711 of the opening 710, and another connection part distinguished from the connection part may be disposed at the other end 712 of the opening 710.

According to an embodiment of the disclosure, the connection part disposed at the end of one opening may be spaced apart from the connection part disposed at the end of an adjacent opening by a length d4 in the direction of the folding axis. For example, the connection part disposed at one end 711 of the opening 710 may be spaced apart from the connection part disposed at one end 721 of the opening 720 adjacent to the opening 710 by a length d4 in the folding axis direction.

According to an embodiment of the disclosure, a connection part disposed at the end of one opening may be spaced apart from a connection part disposed at the end of an adjacent opening by a length d5 shorter than that of the opening in the folding axis direction, thereby reinforcing rigidity in the vertical direction. As illustrated in FIG. 5B, the connection parts 790 may be spaced apart by a length d3 that is equally spaced in a direction perpendicular to the folding axis in a region other than the region P4.

Referring to FIG. 7B, unlike FIG. 7A, at least one connection part 790 of the support member 330 may be removed only in the region P3 of the plurality of openings 710. The region P3 may be a region overlapping the screws 370-1 and 370-2. For example, one end of the openings positioned at both sides in a direction perpendicular to the folding axis of the area P3 in which the screw 370-1 is disposed may be disposed at both sides of the area P3 perpendicular to the folding axis. For example, one end 712 of both end portions 711 and 712 of the opening 710 disposed on the left side of the region P3 may be disposed between the region P3 and the second rigid region 332. Even in the case of an opening disposed on the right side of the region P3, one end of both ends of the opening disposed on the right side may be disposed between the region P3 and the first rigid region 331. The connection part 790 between the opening 710 and the opening 720 disposed along the folding axis on the side surface of the region P3 may be positioned on the side surface of the region P3. For example, a connection part 790 may be disposed between one end 712 adjacent to the opening 720 among both end parts 711 and 712 of the opening 710 and the other end 722 adjacent to the opening 710 among both end parts 721 and 722 of the opening 720.

According to an embodiment of the disclosure, in FIG. 7A, an openings that do not overlap the region P4 may have the same length, and in FIG. 7B, an openings that do not overlap the region P3 may have the same length.

According to the above-described embodiment of the disclosure, the support member 330, in an area in which the screws 370-1 and 370-2 are exposed or overlapping area (e.g., area P3), may remove the connection part positioned at the ends of the openings to prevent interference between the less inserted portions of the screws 370-1 and 370-2 and the pattern of the support member 330 to avoid contact due to abnormal coupling of the screws. Since the flexible display panel 230 is close to a hinge structure (e.g., a hinge structure 260 of FIG. 2C) or a screw coupling the hinge structure, the flexible display panel 230 prevent damage to the support member 330 due to an external impact by remove the connection part to reduce interference between the protruding unit of the screw and the pattern.

Figure 8A:
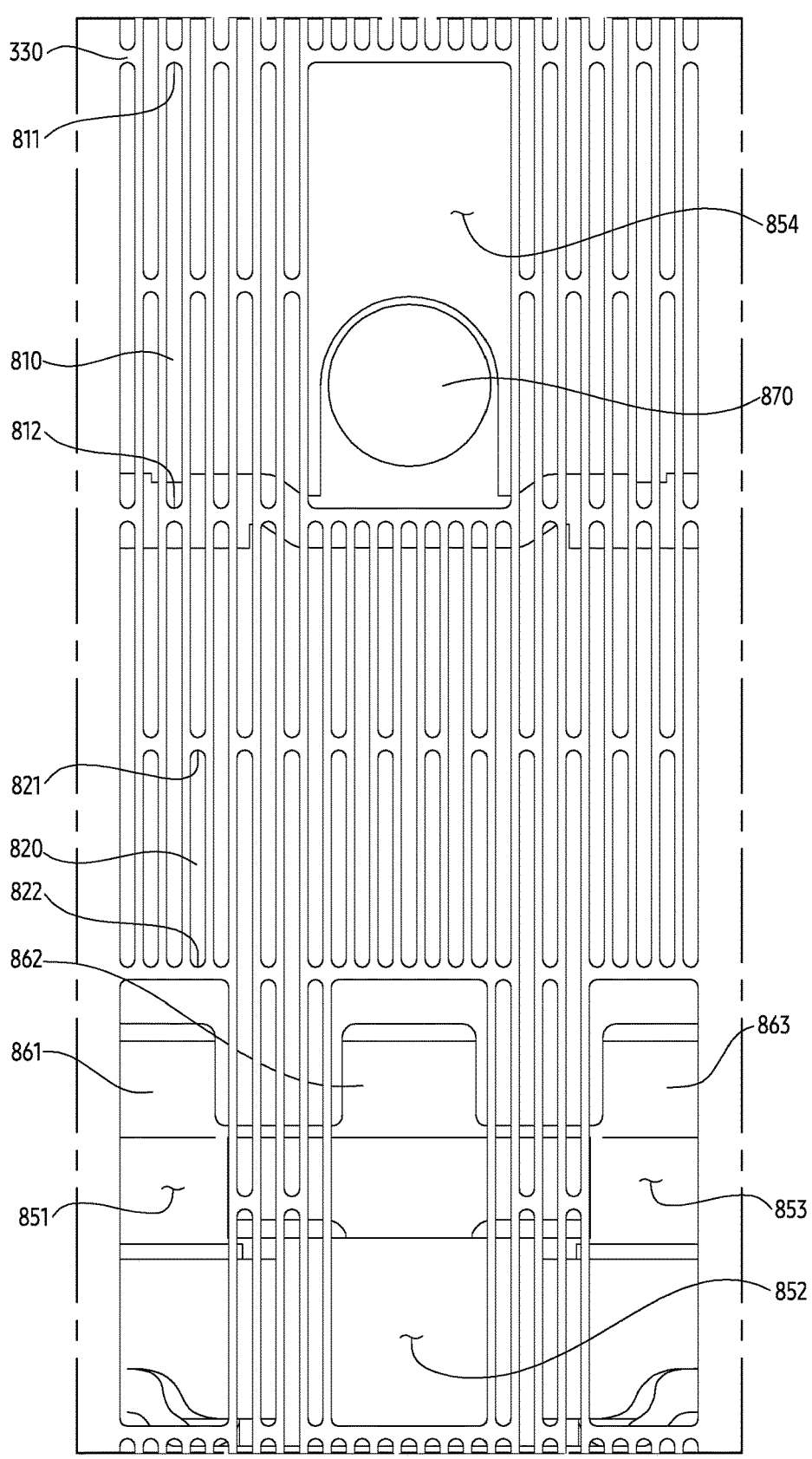
FIGS. 8A, 8B, and 8C illustrate configurations in which openings constituting a support member avoid interference between internal structures of an electronic device according to various embodiments of the disclosure.
Figure 8B:
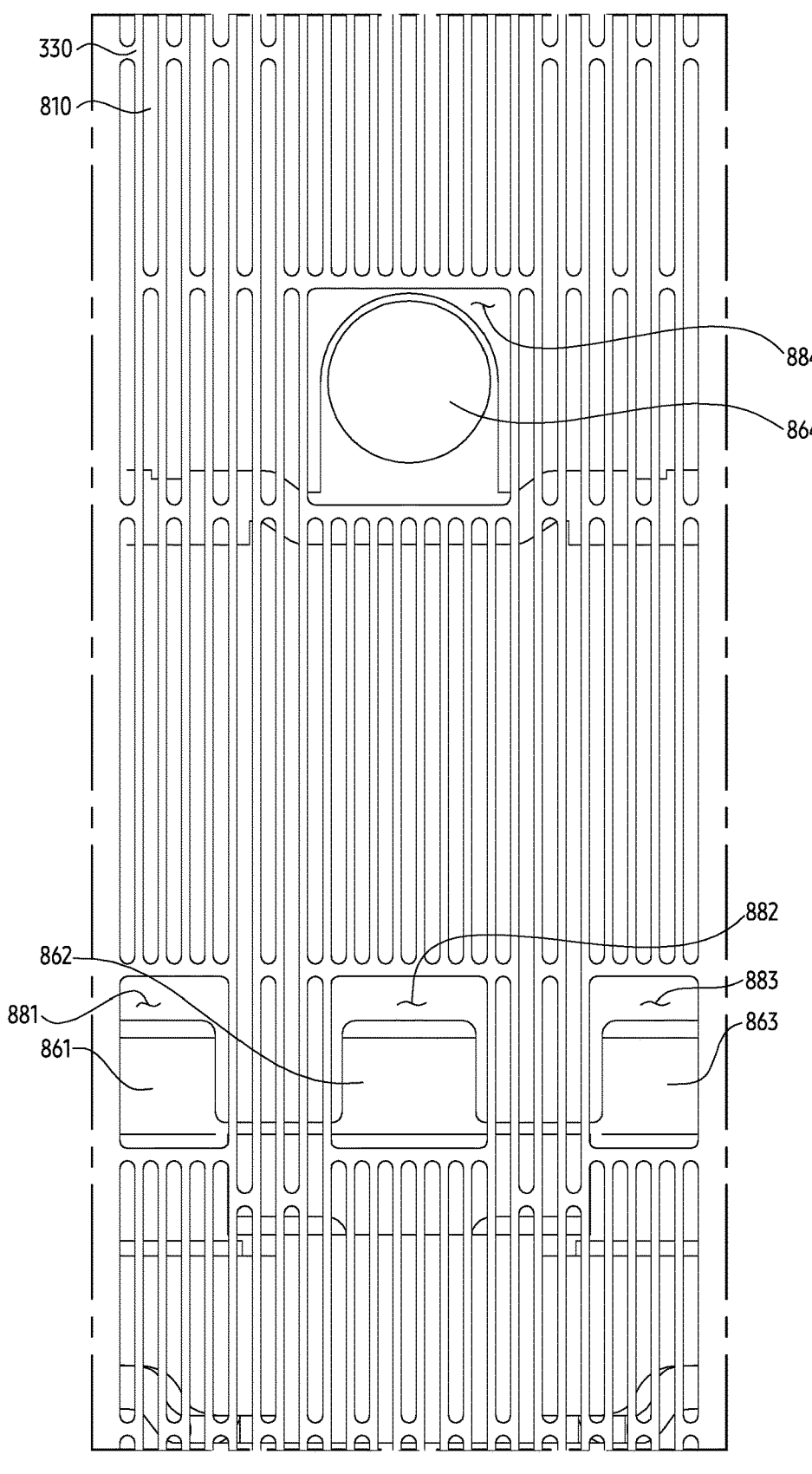
Figure 8C:
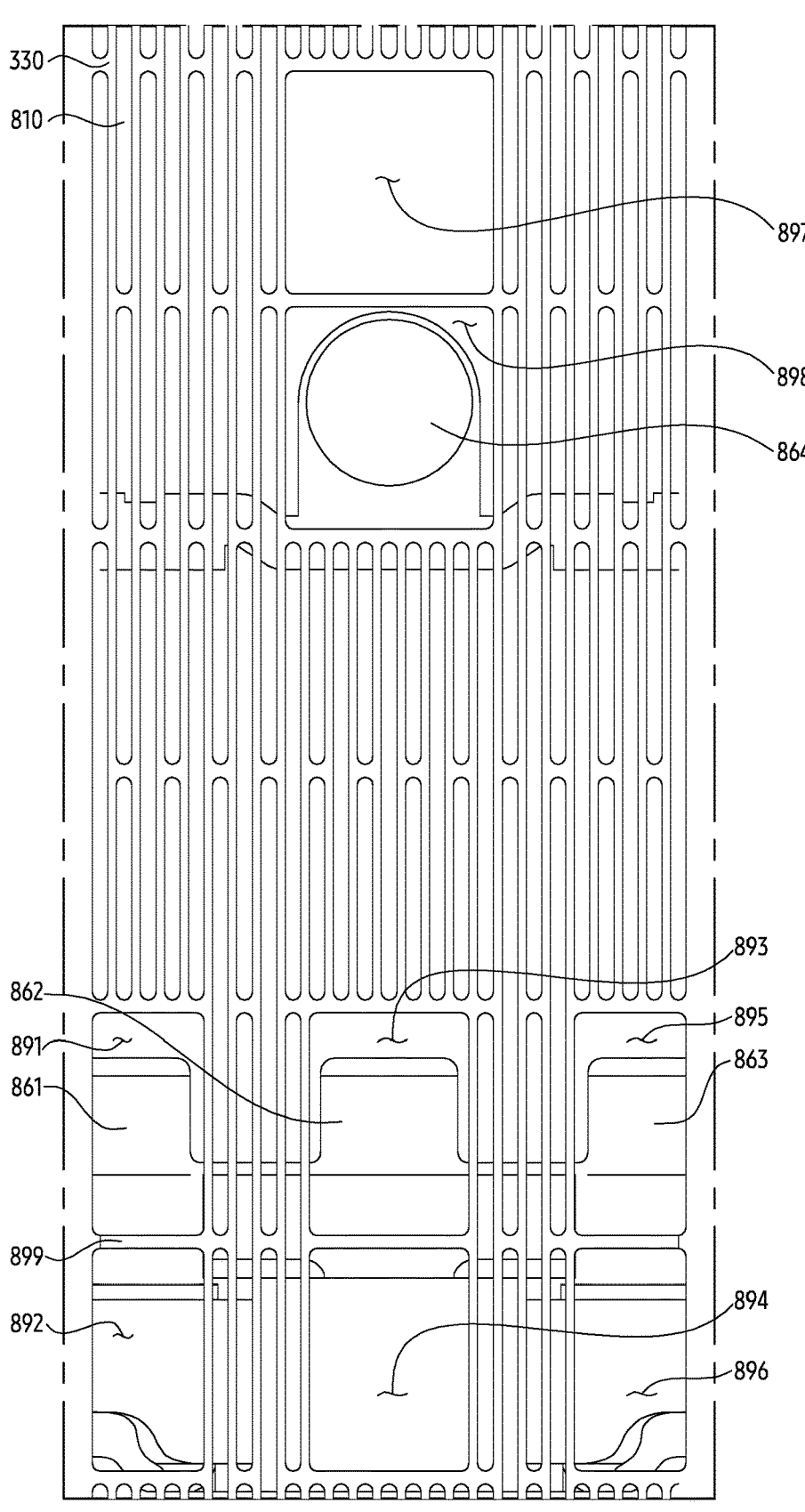

FIGS. 8A, 8B, and 8C illustrate configurations in which openings constituting a support member avoid interference between internal structures of an electronic device according to various embodiments of the disclosure.

Referring to FIG. 8A, the support member 330 may include a plurality of openings. Among the openings, the openings 851, 852, and 853 overlapping a plurality of gears 861, 862, and 863 and the opening 854 overlapping the screw 864 may have a width greater than that of the other openings 810, 811, 812, 820, 821, and 822. For example, the openings 810 and 820 may have a width narrower than that of a plurality of gears 861, 862, 863, or screw 864. The opening overlapping a portion of the gears 861 and 863 disposed at the boundary of the flexible area 333 may be formed as regions overlapping the gears 861 and 863 in the flexible area 333. The opening overlapping the gear 862 completely overlapping the flexible region 333 may have a width greater than the width of the exposed gear 862. The screw 864 disposed on the folding axis 237 may have a width greater than that of the exposed screw 864.

The support member 330 may be formed through the arrangement of openings 810 having the same length except for some of the openings 820 adjacent to the openings 851, 852, 853, and 854 overlapping a plurality of gears 861, 862, 863, or screw 864. The openings 851, 852, 853, and 854 overlapping the plurality of gears 861, 862, and 863 or the screw 864 may have the same length as the opening 810.

According to the above-described embodiment of the disclosure, when an opening overlapping a hinge structure (e.g., the hinge structure 260 of FIG. 2C), such as a screw 864, a plurality of gears 861, 862, and 863 is formed as one, the support member 330 may be formed to have the same length as the openings to remove a part of the formed opening pattern, thereby being simply formed. The flexible region 333 of the support member 330 may prevent damage to the support member 330 by removing patterns overlapping a plurality of gears 861, 862, and 683 and the screw 864, and reduce an impact applied to the flexible display.

Referring to FIGS. 8A and 8B, in the structure of FIG. 8A, the support member 330 may form lengths of the openings 881, 882, 883, and 884 overlapping the plurality of gears 861, 862, and 863 or the screw 864 to be different from the lengths of the openings 810. For example, openings 881, 882, 883, and 884 having shapes corresponding to widths and lengths of a plurality of gears 861, 862, and 863 and a screw 864 may be formed. The openings 881 and 883 overlapping the gears 861 and 863 partially overlapping the first rigid region 331 and the second rigid region 332 may be formed to have a width overlapping the flexible area 333 and may be formed to have a length corresponding to the exposed regions of the gears 861 and 863. The gear 862 disposed on the folding axis and the openings 882 and 884 overlapping the screw 864 may have a shape corresponding to the width and length of the gear 862 and the screw 864.

Referring to FIGS. 8A and 8C, as shown in FIG. 8A, a connection part 899 formed in a vertical direction on the folding axis may be provided in order to maintain the rigidity of the openings overlapping the plurality of gears 861, 862, and 883 and the screw 864 while maintaining the lengths of the openings at equal intervals. For example, the openings 851, 852, 853, and 854 of FIG. 8A in which a plurality of gears 861, 862, and 863 and the screw 864 overlap may have connection part 899 formed in a direction perpendicular to the folding axis. The opening 851 may be separated into an opening 891 and an opening 892 by a connection part 899, the opening 852 may be separated into an opening 893 and an opening 894 by a connection part 899, and the opening 853 may be separated into an opening 895 and an opening 896. According to an embodiment of the disclosure, the opening 854 overlapping the screw 864 may be separated into the opening 897 and the opening 898 by a connection portion 899.

According to the above-described embodiment of the disclosure, the support member 330 may avoid interference with the screw 864, a plurality of gears 861, 862, and 863 by strengthen the stiffness when an opening overlapping a hinge structure (e.g., the hinge structure 260 of FIG. 2C), such as a plurality of gears 861, 862, and 863 is formed as one and may maintain rigidity of the support member 330.

An electronic device (e.g., the electronic device 101 of FIG. 2A) may comprise a first housing (e.g., the first housing 210 of FIG. 2A) including a first surface (e.g., the first surface 211 of FIG. 2A) and a second surface (e.g., the second surface 212 of FIG. 2A) faced away the first surface; a second housing (e.g., the second housing 220 of FIG. 2A) including a third surface (e.g., the third surface 221 of FIG. 2A) and a fourth surface (e.g., the fourth surface 222 of FIG. 2A) faced away the fourth surface; a hinge structure (e.g., hinge structure 260 of FIG. 2C) configured to switch the electronic device to an unfolded state in which a first direction facing the first surface and a second direction facing the second surface are the same or a folded state in which the first direction and the second direction are different, by connecting a side surface of the first housing and a side surface of the second surface facing the side surface of the first housing rotatably along a folding axis and a plurality of gears disposed in a direction perpendicular to the folding axis and rotating in engagement with each other; a flexible display panel (e.g., the flexible display panel 230 of FIG. 2A) including a first display area disposed on the first surface and the third surface across the folding axis, a second display area corresponding to the third surface, and a third display area between the first display area and the second display area; and a supporting member (e.g., the support member 330 of FIG. 3A) supporting the flexible display panel, the supporting member including a flexible region (e.g., the flexible region 333 of FIG. 3A) including a plurality of openings having a length in a direction parallel to the folding axis, space apart from each other, and corresponding to the third display area, and rigid regions (e.g., rigid regions 331 and 332 of FIG. 3A) corresponding to the first display area and the second display area, wherein the plurality of gears are disposed under the first region (e.g., regions P1-1, P1-2, and P1-3) of FIG. 5A) among the first region and the second region, and wherein both ends of each of the openings at least partially overlapped on the plurality of gears among the plurality of openings are disposed in the second region.

According to an embodiment of the disclosure, the rigid regions may include a first rigid region (e.g., the first rigid region 331 of FIG. 3A) corresponding to the first display region and a second rigid region corresponding to the second display region and may further include a first hinge plate (e.g., the first hinge plate 266 of FIG. 4A) supporting the first rigid region and a second hinge plate (e.g., the second hinge plate 267 of FIG. 4A) supporting the second rigid region, and spaced apart from the first hinge plate and in the unfolded state, an area in which the support member is exposed to the plurality of gears through an interval between the first hinge plate and the second hinge plate may be narrower than an area in which the support member is exposed to the plurality of gears through the interval.

According to an embodiment of the disclosure, the plurality of gears within the hinge structure may directly are configured to face the flexible region of the supporting member by an expansion of the gap according to the switch from the unfolded state to the folded state.

According to an embodiment of the disclosure, the plurality of openings may include first openings disposed in a perpendicular direction to the folding axis and second openings disposed in the perpendicular direction to the folding axis and disposed between the first openings and wherein a length of each of the first openings is different from a length of each of the second openings.

According to an embodiment of the disclosure, a shape of each of the other openings disposed between the openings among the plurality of openings may correspond to a shape of each of the openings.

According to an embodiment of the disclosure, the supporting member may further include a first openings respectively extending in a first direction from one part of a space between the openings and disposed in a second direction perpendicular to the first direction and a second opening extending in the third direction in another portion of the space spaced apart from the one part in a third direction opposite to the first direction and disposed along the second direction and disposed along the second direction.

According to an embodiment of the disclosure, each of the openings at least partially overlapped on the plurality of gears among the plurality of openings may have a width in a vertical direction of the folding axis wider than each of remaining openings of the plurality of openings.

According to an embodiment of the disclosure, each of the openings at least partially overlapped on the plurality of gears among the plurality of openings may have a length in a direction of the folding axis wider than each of remaining openings of the plurality of openings.

According to an embodiment of the disclosure, the hinge structure may include a first plurality of gears that are the plurality of gears, and a second plurality of gears that are distinct from the first plurality of gears and share a folding axis with the first plurality of gears and wherein a distance between each of the first plurality of gears and one periphery of the first surface perpendicular to the folding axis may be shorter than a distance between each of the second plurality of gears and the one periphery of the first surface According to an embodiment of the disclosure, the supporting member may be formed of metal, reinforced plastic, or a combination thereof.

According to an embodiment of the disclosure, an electronic device (e.g., the electronic device 101 of FIG. 2A) may comprise a first housing (e.g., the first housing 210 of FIG. 2A) including a first surface (e.g., the first surface 211 of FIG. 2A) and a second surface (e.g., the second surface 212 of FIG. 2A) faced away the first surface; a second housing (e.g., the second housing 220 of FIG. 2A) including a third surface (e.g., the third surface 221 of FIG. 2A) and a fourth surface faced away the fourth surface (e.g., the fourth surface 222 of FIG. 2A); a hinge structure (e.g., hinge structure 260 of FIG. 2C) configured to switch the electronic device to an unfolded state in which a first direction facing the first surface and a second direction facing the third surface are the same or a folded state in which the first direction and the second direction are different from each other, by connecting a side surface of the first housing and a side surface of the second surface facing the side surface of the first housing rotatably along a folding axis, the hinge structure including a plurality of gears disposed in a direction perpendicular to the folding axis and rotating in engagement with each other; a flexible display panel (e.g., the flexible display panel 230 of FIG. 2A) including a first display area disposed on the first surface and the third surface across the folding axis, a second display area corresponding to the third surface, and a third display area between the first display area and the second display area; and a supporting member supporting the flexible display panel and including a flexible region (e.g., the flexible region 333 of FIG. 3A), the supporting member including a plurality of openings having a length in a direction parallel to the folding axis, spaced apart from each other, and corresponding to the third display area, and a rigid region (e.g., rigid regions 331 and 332 of FIG. 3A) corresponding to the first display area and the second display area; wherein both ends of each of the openings at least partially overlapped on the plurality of gears among the plurality of openings are disposed outside the plurality of gears projected on the support member (e.g., the support member 330 of FIG. 3A).

According to an embodiment of the disclosure, the hinge structure may further include at least one screw (e.g., screws 370-1, 370-2, 370-3, 370-4 of FIG. 3A) spaced apart the plurality of gears, and wherein both ends of each of other openings at least partially overlapped on the at least one screw among the plurality of openings may be disposed outside the at least one screw projected on the supporting member.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic,"

"logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first housing part;
a second housing part;
a hinge structure, rotatably connecting the first housing part and the second housing part, including a set of gears, wherein the first housing part and the second housing part are rotated via the set of gears;
a flexible display panel including a portion configured to be bent when the electronic device is in a folded state in which the first housing part and the second housing part are folded with respect to each other through relative rotation of the first housing part and the second housing part about a folding axis; and
a supporting plate supporting the flexible display panel, disposed between the flexible display panel and the hinge structure,
wherein the supporting plate includes a portion configured to be bent when the electronic device is in the folded state,
wherein the portion of the supporting plate includes:
first openings, wherein each of the first openings extends in a longitudinal direction parallel to the folding axis;
second openings;
third openings, wherein each of the first openings is positioned between a corresponding one of the second openings and a corresponding one of the third openings;
first bridge portions, wherein each of the first bridge portions is defined between an end of each of the first openings and an end of the corresponding one of the second openings; and
second bridge portions, wherein each of the second bridge portions is defined between another end of each of the first openings and an end of the corresponding one of the third openings,
wherein the first bridge portions and the second bridge portions of the supporting plate, when the supporting plate is viewed from above, are positioned out of the set of gears such that an area of the first openings at least partially overlaps an area of the set of the gears in a direction of a surface of the supporting plate facing the hinge structure.

2. The electronic device of claim 1, wherein, when the supporting plate is viewed from above, the first bridge portions and the second bridge portions do not overlap the set of gears.

3. The electronic device of claim 1,
wherein the first openings include a first opening disposed on a first gear of the set of gears and a second opening disposed next to the first opening and spaced apart from the set of gears when viewed from above, and
wherein a length of the first opening is longer than a length of the second opening.

4. The electronic device of claim 1, further comprising:
a first hinge plate and a second hinge plate spaced apart from the first hinge plate and connecting to the hinge structure,
wherein an area in which the portion of the support plate is exposed to the set of gears through a gap between the first hinge plate and the second hinge plate, in an unfolded state in which the first housing part and the second housing part are unfolded with respect to each other, is narrower than an area in which the supporting plate is exposed to the set of gears through the gap, in the folded state.

5. The electronic device of claim 1, wherein a shape of each of the first openings is same.

6. The electronic device of claim 1,
wherein each of the second openings extends in a longitudinal direction parallel to the folding axis,
wherein each of the third openings extends in a longitudinal direction parallel to the folding axis, and
wherein the first openings include:
a first opening positioned such that a portion of the first opening is located between two of the second openings; and
a second opening positioned such that a portion of the second opening is located between two of the third openings.

7. The electronic device of claim 1,
wherein, when the supporting plate is viewed from above, the first openings include a first opening that at least partially overlaps the set of gears and a second opening that does not overlap the set of gears, and
wherein a width of the first opening is greater than a width of the second opening.

8. The electronic device of claim 7,
wherein the first opening that at least partially overlaps the set of gears has a length shorter than a length of the second opening that does not overlap the set of gears.

9. The electronic device of claim 1,
wherein the hinge structure includes another set of gears next to the set of gears.

10. The electronic device of claim 1, wherein the supporting plate is formed of metal, reinforced plastic, or a combination thereof.

11. An electronic device comprising:
a first housing part
a second housing part;
a hinge structure, rotatably connecting the first housing part and the second housing part, including gears, wherein the first housing part and the second housing part are rotated via the gears;
a flexible display panel including a portion configured to be bent when the electronic device is in a folded state in which the first housing part and the second housing part are folded with respect to each other through relative rotation of the first housing part and the second housing part about a folding axis; and
a supporting plate supporting the flexible display panel, disposed between the flexible display panel and the hinge structure,
wherein the supporting plate includes a portion configured to be bent when the electronic device is in the folded state,
wherein the portion of the supporting plate includes:
first openings disposed along a direction perpendicular to the folding axis, wherein each of the first openings extends in a longitudinal direction parallel to the folding axis;
second openings;
third openings, wherein each of the first openings is positioned between a corresponding one of the second openings and a corresponding one of the third openings;
first bridge portions, wherein each of the first bridge portions is defined between an end of each of the first openings and an end of the corresponding one of the second openings; and second bridge portions, wherein each of the second bridge portions is defined between another end of each of the first openings and an end of the corresponding one of the third openings,
wherein the first bridge portions and the second bridge portions of the supporting plate, when the supporting plate is viewed from above, are positioned out of the set of gears such that an area of the first openings at least partially overlaps an area of the set of the gears in a direction of a surface of the supporting plate facing the hinge structure.

12. The electronic device of claim 11,
wherein the first openings include a first opening disposed on a first gear of the gears and a second opening disposed next to the first opening and spaced apart from the gears when viewed from above.

13. The electronic device of claim 12,
wherein a length of the first opening is longer than a length of the second opening.

14. The electronic device of claim 11, further comprising:
a first hinge plate and a second hinge plate spaced apart from the first hinge plate and connecting to the hinge structure,
wherein an area in which the portion of the support plate is exposed to the gears through a gap between the first hinge plate and the second hinge plate, in an unfolded state in which the first housing part and the second housing part are unfolded with respect to each other, is narrower than an area in which the supporting plate is exposed to the gears through the gap, in the folded state.

15. The electronic device of claim 11, wherein a shape of each of the first openings is same.

16. The electronic device of claim 11,
wherein each of the second openings extends in a longitudinal direction parallel to the folding axis,
wherein each of the third openings extends in a longitudinal direction parallel to the folding axis, and
wherein the first openings include:
a first opening positioned such that a portion of the first opening is located between two of the second openings; and
a second opening positioned such that a portion of the second opening is located between two of the third openings.

17. The electronic device of claim 11,
wherein, when the supporting plate is viewed from above, the first openings include a first opening that at least partially overlaps the set of gears and a second opening that does not overlap the set of gears, and
wherein a width of the first opening is greater than a width of the second opening.

18. The electronic device of claim 17,
wherein the first opening that at least partially overlaps the set of gears has a length shorter than a length of the second opening that does not overlap the set of gears.

19. The electronic device of claim 11, wherein the hinge structure includes first gears that are the gears, and second gears that are next to the first gears.

20. The electronic device of claim 1,
wherein the first openings are aligned to the set of gears in the direction of the surface of the supporting plate facing the hinge structure.

* * * * *